US008581112B2

(12) United States Patent
Shimasaki

(10) Patent No.: US 8,581,112 B2
(45) Date of Patent: Nov. 12, 2013

(54) COUPLER APPARATUS

(71) Applicant: Kabushiki Kaisha Toshiba, Tokyo (JP)

(72) Inventor: Hiroshi Shimasaki, Kunitachi (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 13/743,066

(22) Filed: Jan. 16, 2013

(65) Prior Publication Data

US 2013/0128437 A1 May 23, 2013

Related U.S. Application Data

(63) Continuation of application No. 13/184,376, filed on Jul. 15, 2011, now abandoned.

(30) Foreign Application Priority Data

Jul. 23, 2010 (JP) .................................. 2010-166290

(51) Int. Cl.
*H05K 1/16* (2006.01)
*H04B 1/26* (2006.01)
*H01Q 13/00* (2006.01)

(52) U.S. Cl.
USPC ........... 174/260; 174/262; 361/760; 455/318; 455/319; 343/771; 343/846; 343/908

(58) Field of Classification Search
USPC ......... 174/260–261; 361/760; 455/41.1, 41.2, 455/318, 319; 343/770, 795, 830, 846, 848, 343/908
See application file for complete search history.

(56) References Cited

U.S. PATENT DOCUMENTS

| 5,121,127 A | 6/1992 | Toriyama |
| 6,762,729 B2 | 7/2004 | Egashira |
| 6,995,732 B2 * | 2/2006 | Goebel et al. ................. 343/908 |
| 7,256,743 B2 * | 8/2007 | Korva ........................... 343/702 |
| 7,890,053 B2 | 2/2011 | Washiro |
| 7,894,770 B2 | 2/2011 | Washiro |
| 2004/0058723 A1 * | 3/2004 | Mikkola et al. ............. 455/575.7 |
| 2007/0290931 A1 * | 12/2007 | Utagawa et al. ....... 343/700 MS |
| 2008/0064331 A1 | 3/2008 | Washiro |

(Continued)

FOREIGN PATENT DOCUMENTS

| JP | 2006-013878 | 1/2006 |
| JP | 2008-099234 | 4/2008 |
| JP | 2008-099235 | 4/2008 |
| JP | 2008-099236 | 4/2008 |
| JP | 2009-100453 | 5/2009 |
| WO | WO 2008/132785 A1 | 11/2008 |

OTHER PUBLICATIONS

What is "TransferJet"?!/Digital Station/J-Net21 [small- and medium-sized enterprise business assistance site], Apr. 1, 2009, URL [http://j-net21.smrj.go.jp/develop/digital/entry/001-20090401-10.html].

(Continued)

*Primary Examiner* — Hoa C Nguyen
(74) *Attorney, Agent, or Firm* — Knobbe Martens Olson & Bear LLP

(57) ABSTRACT

According to one embodiment, a coupler apparatus includes a coupling element and a ground plane. The coupling element comprises a conductive material and configured to be subjected to power feeding to a feeding point. The ground plane comprises a conductive material and faces the coupling element. The coupling element has one or more through holes along an alignment direction of the coupling element and the ground plane.

6 Claims, 17 Drawing Sheets

(56) References Cited

U.S. PATENT DOCUMENTS

| | | |
|---|---|---|
| 2008/0076351 A1 | 3/2008 | Washiro |
| 2008/0153416 A1 | 6/2008 | Washiro |
| 2010/0019976 A1 | 1/2010 | Sakiyama et al. |
| 2011/0110404 A1 | 5/2011 | Washiro |

OTHER PUBLICATIONS

First Office Action mailed by JPO on Jan. 17, 2012, for Japanese Application No. 2010-166290.

* cited by examiner

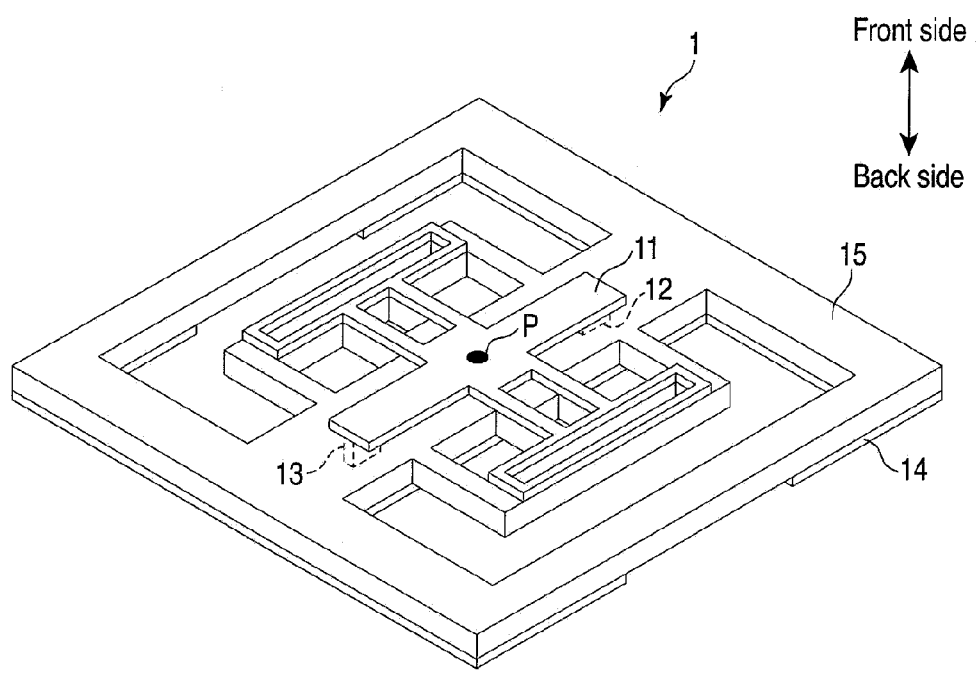
F I G. 1

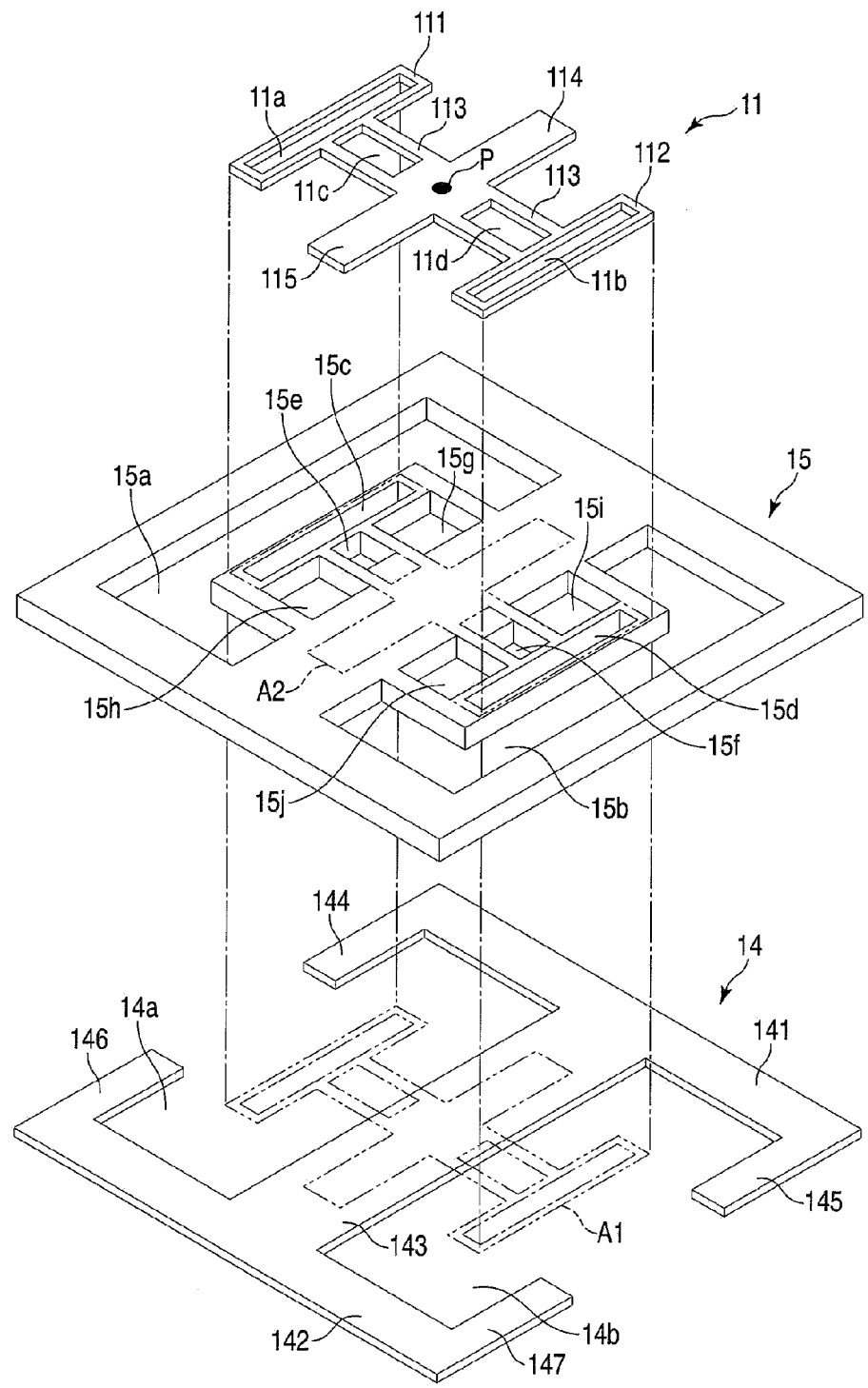
F I G. 2

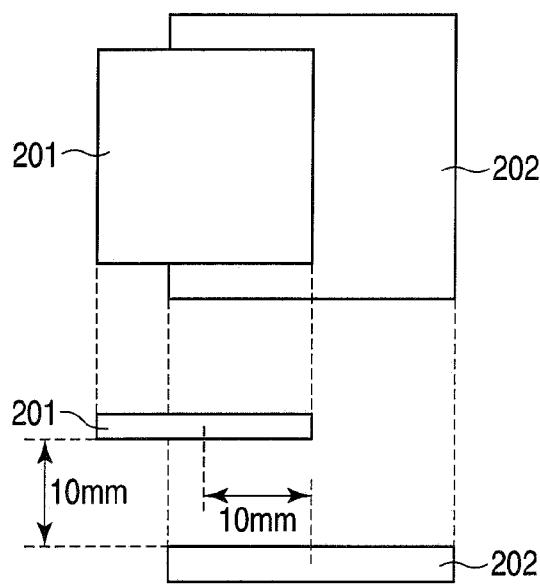
F I G. 8
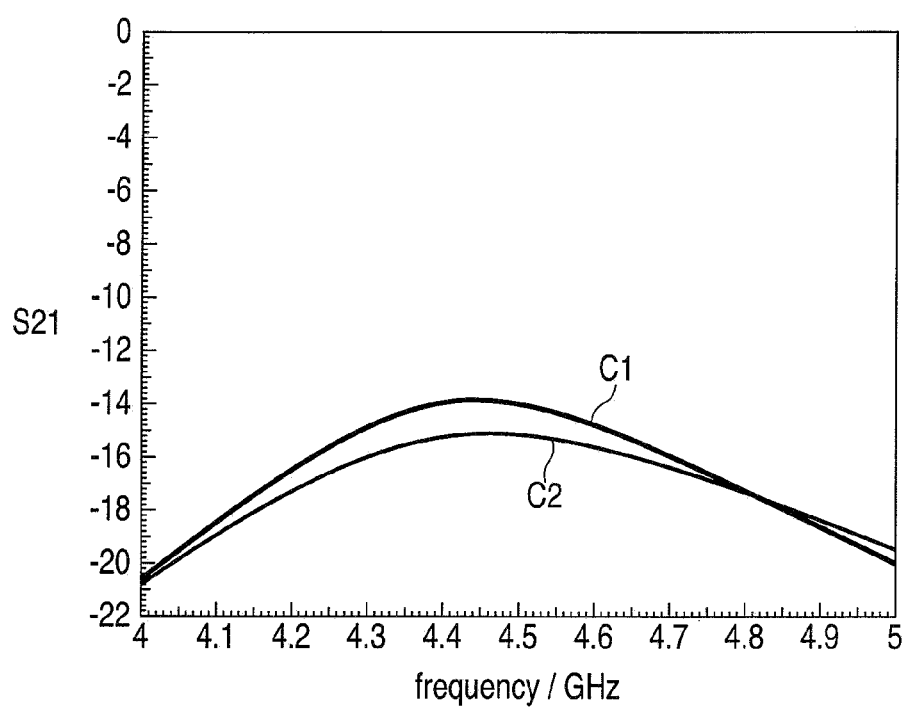
F I G. 9

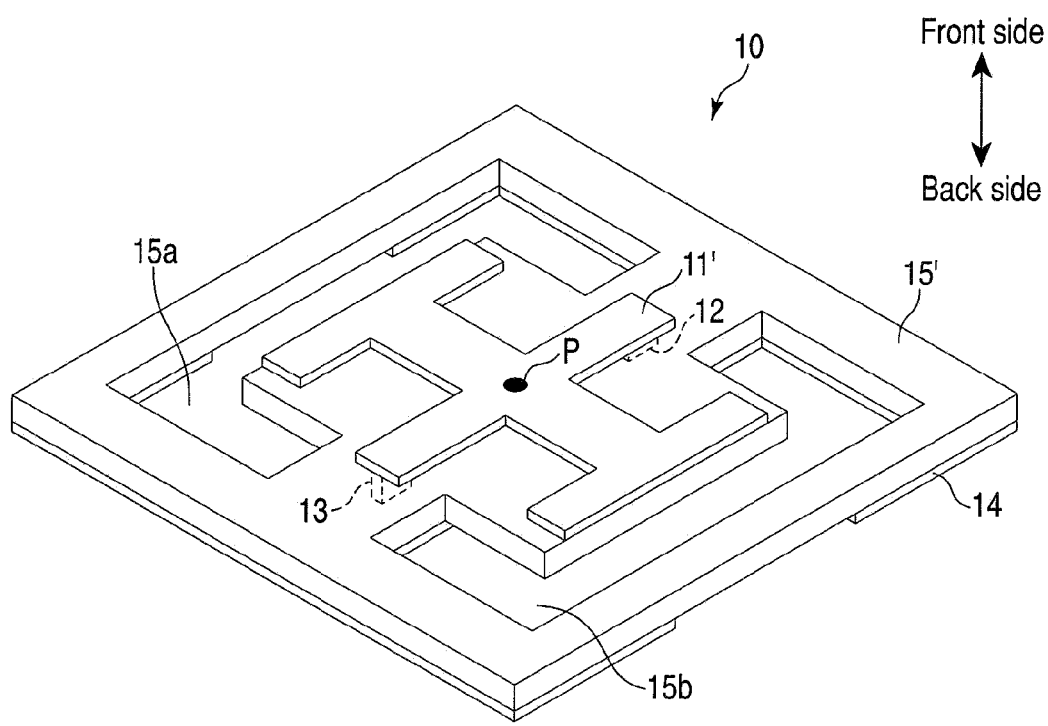
F I G. 10
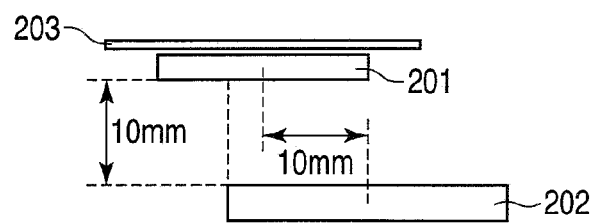
F I G. 11

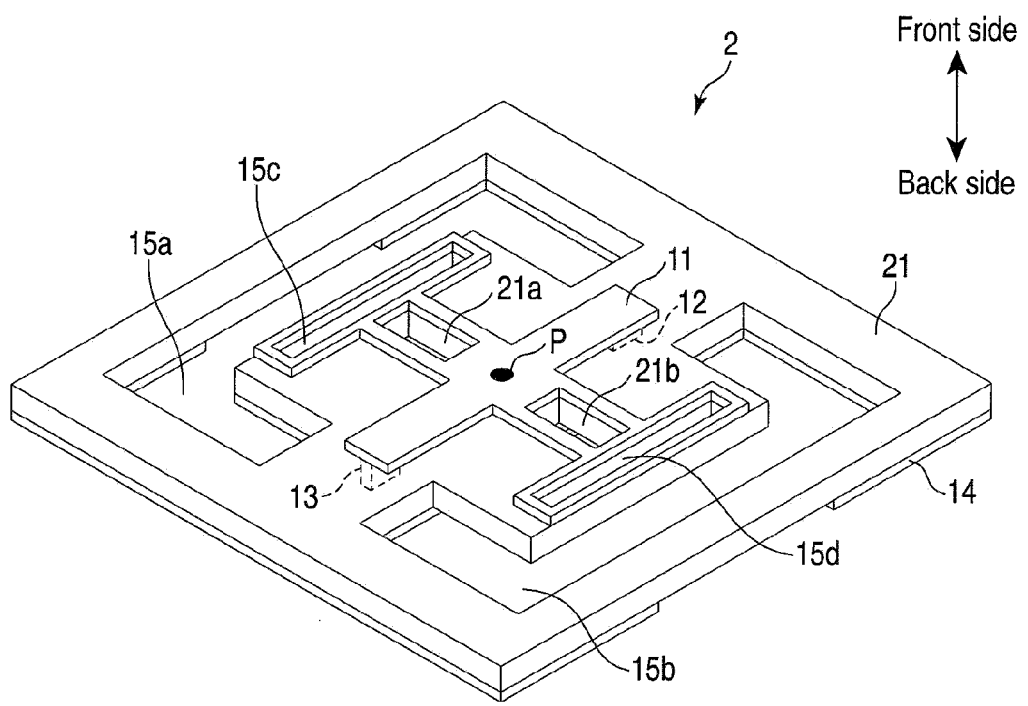
F I G. 14
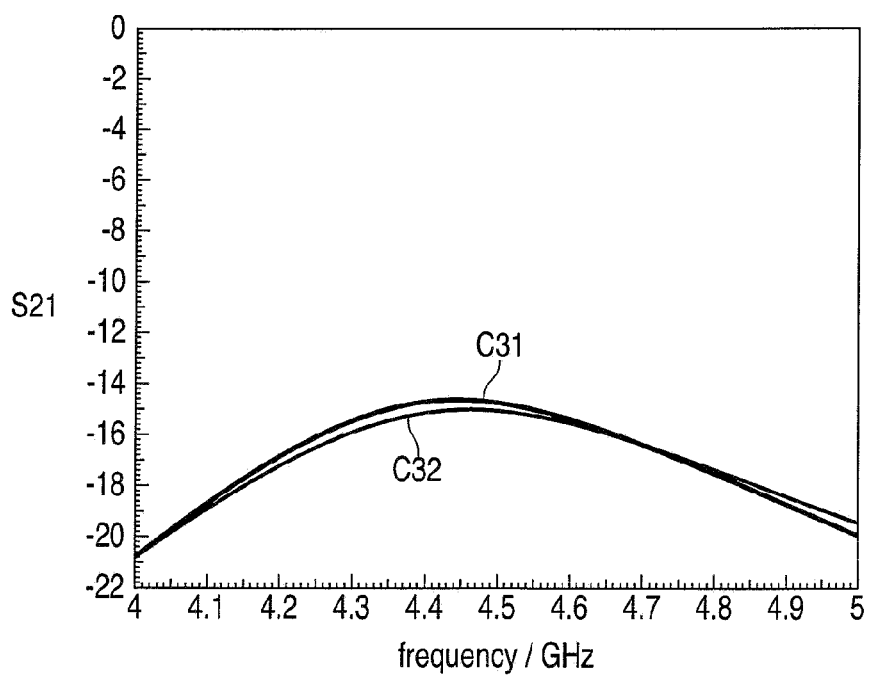
F I G. 15

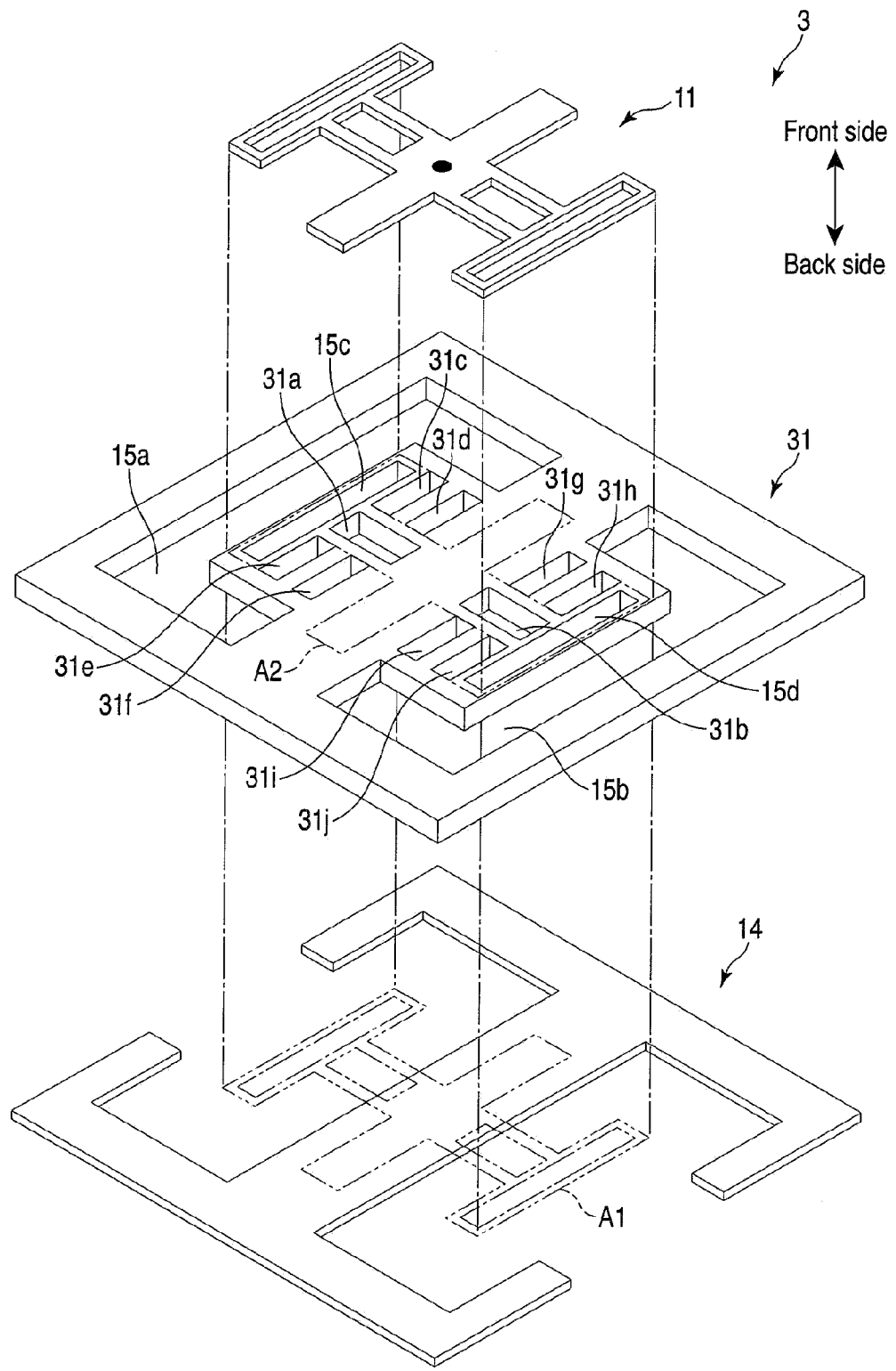
F I G. 16

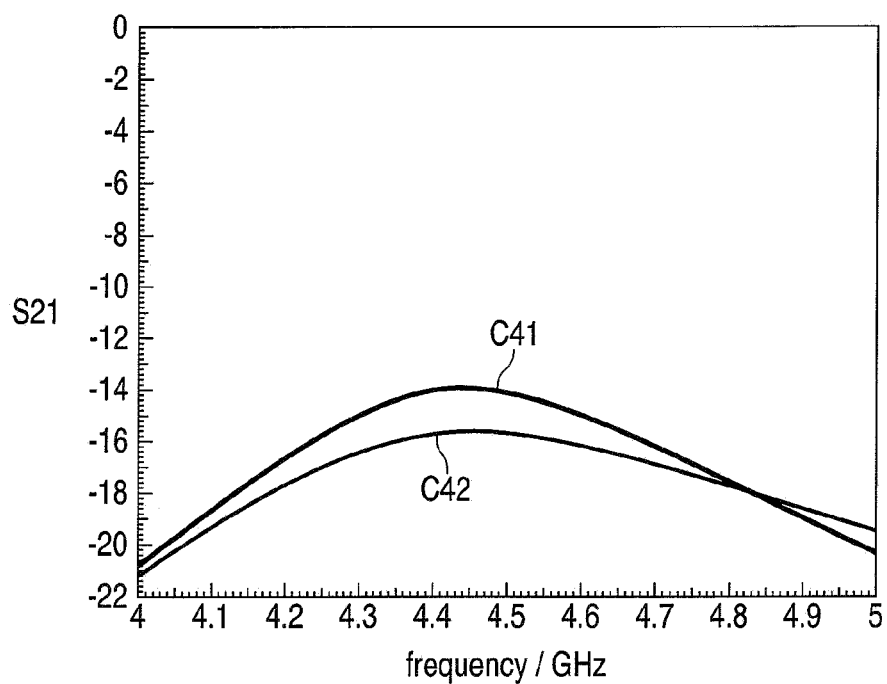
F I G. 17
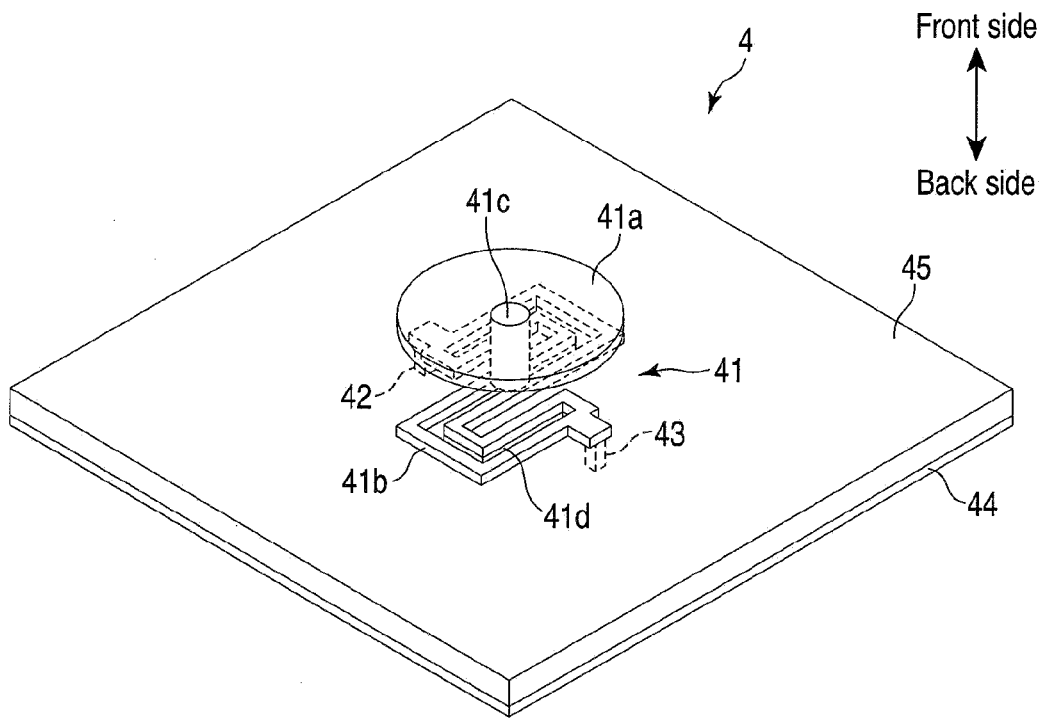
F I G. 18

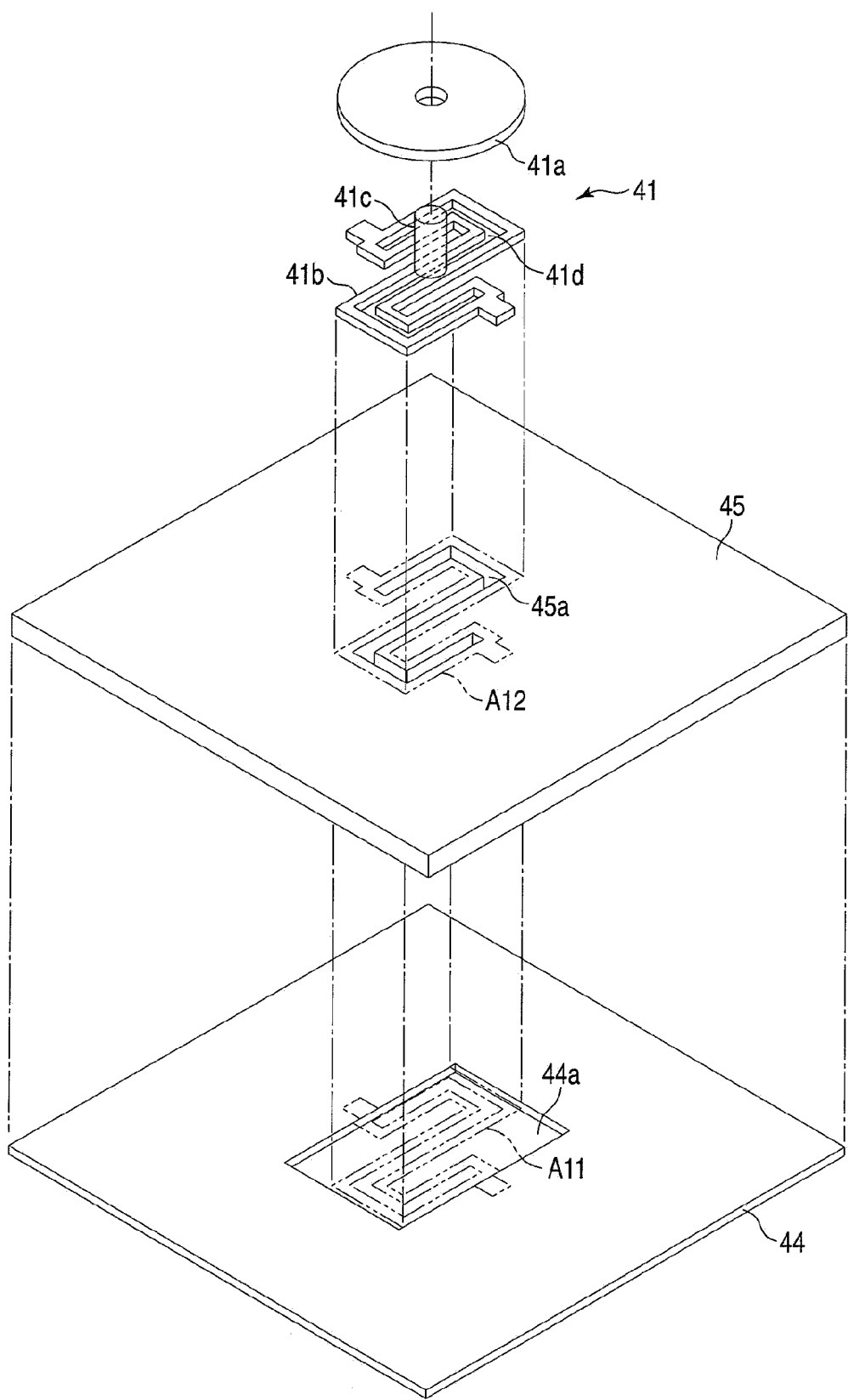
F I G. 19

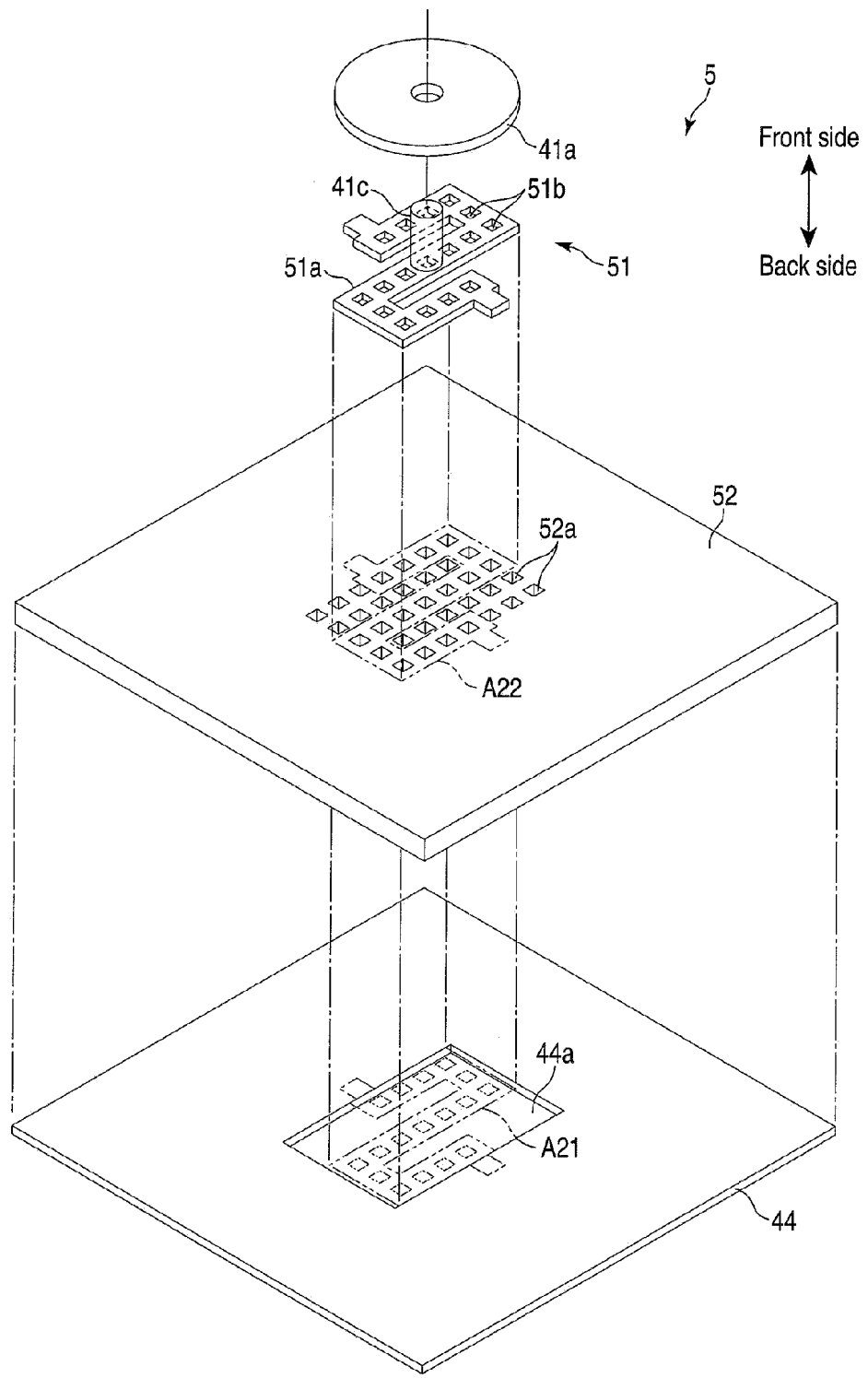
F I G. 20

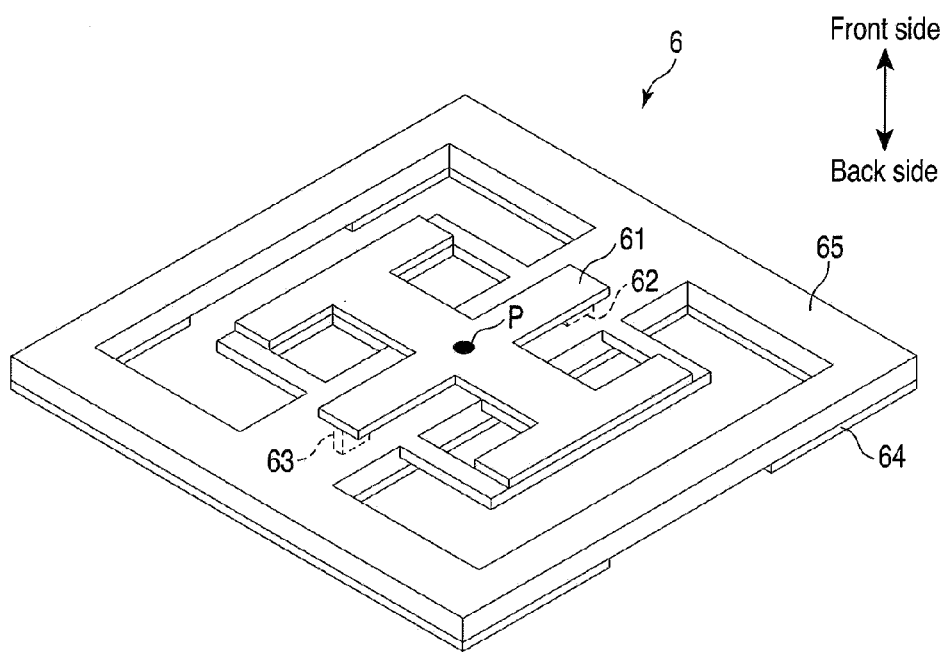
F I G. 21

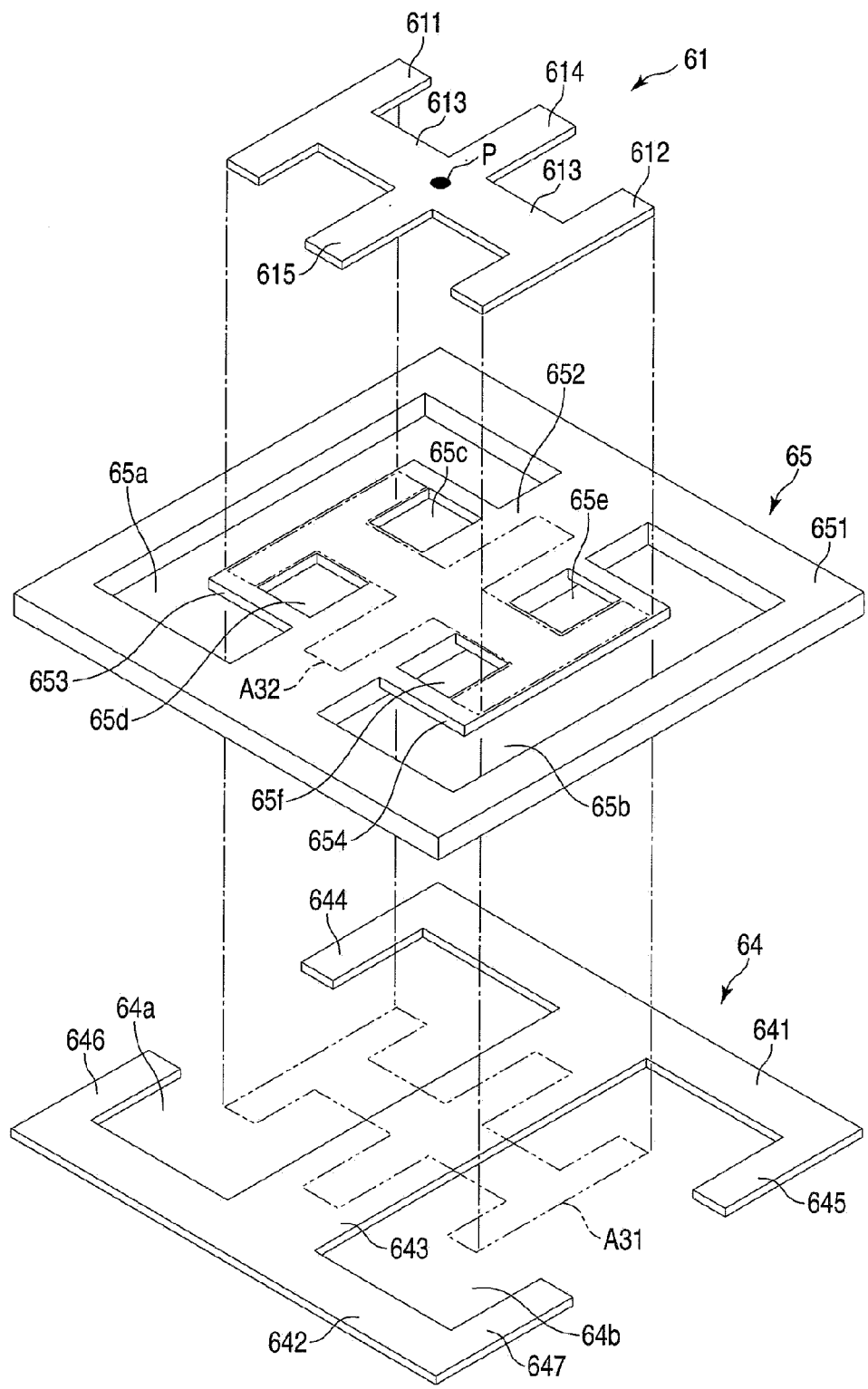
F I G. 22

COUPLER APPARATUS

CROSS-REFERENCE TO RELATED APPLICATIONS

This application is a continuation of U.S. patent application Ser. No. 13/184,376 filed on Jul. 15, 2011, which is based upon and claims the benefit of priority from Japanese Patent Application No. 2010-166290, filed Jul. 23, 2010; the entire contents of both of which are incorporated herein by reference.

FIELD

Embodiments described herein relate generally to a coupler apparatus.

BACKGROUND

In general, a coupler apparatus is constituted by arranging a coupling element and a ground plane, each of which is obtained by forming a conductive material into a tabular shape, to face each other. Further, in the coupler apparatus on a transmission side, an electromagnetic field is generated around the coupler apparatus by feeding a signal to a portion between the coupling element and the ground plane to generate an electric current in the coupling element, thereby producing electromagnetic coupling between this coupler apparatus and a coupler apparatus on a reception side. In the coupler apparatus on the reception side, the above-described signal can be fetched as a potential difference between the coupling element and the ground plane when the electric current is generated in the coupling element based on the produced electromagnetic coupling.

In the coupler apparatus, a tabular dielectric may be arranged between the coupling element and the ground plane in some cases to support the coupling element and the ground plane.

It has been desired to increase a performance of coupling between such a coupler apparatus and another coupling apparatus.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a perspective view of a coupler apparatus according to a first embodiment;

FIG. 2 is an exploded perspective view of the coupler apparatus depicted in FIG. 1;

FIG. 8 is a view showing measurement conditions;

FIG. 9 is a view showing a relationship between a frequency and a transmission coefficient (S21);

FIG. 10 is a perspective view of a coupler apparatus according to a comparative example;

FIG. 11 is a view showing conditions under which an influence of a peripheral metal is verified;

FIG. 14 is a perspective view of a coupler apparatus according to a second embodiment;

FIG. 15 is a view showing a relationship between a frequency and a transmission coefficient (S21);

FIG. 16 is an exploded perspective view of a coupler apparatus according to a third embodiment;

FIG. 17 is a view showing a relationship between a frequency and a transmission coefficient (S21);

FIG. 18 is an exploded perspective view of a coupler apparatus according to a fourth embodiment;

FIG. 19 is an exploded perspective view of the coupler apparatus depicted in FIG. 18;

FIG. 20 is an exploded perspective view of a coupler apparatus according to a fifth embodiment;

FIG. 21 is a perspective view of a coupler apparatus according to a sixth embodiment;

FIG. 22 is an exploded perspective view of the coupler apparatus depicted in FIG. 21;

DETAILED DESCRIPTION

Various embodiments will be described hereinafter with reference to the accompanying drawings.

In general, according to one embodiment, a coupler apparatus includes a coupling element and a ground plane. The coupling element comprises a conductive material and configured to be subjected to power feeding to a feeding point. The ground plane comprises a conductive material and faces the coupling element. The coupling element has one or more through holes along an alignment direction of the coupling element and the ground plane.

First Embodiment

Figure 3:
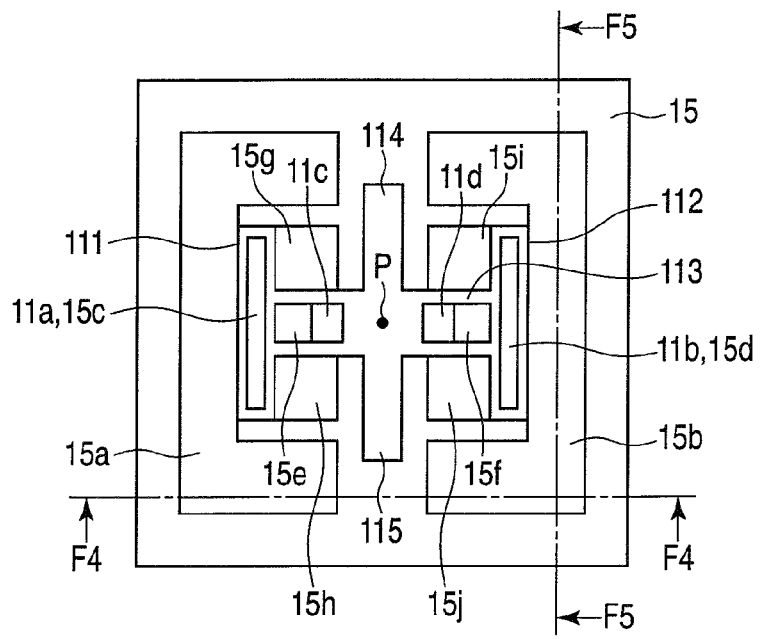
FIG. 3 is a plan view of the coupler apparatus depicted in FIG. 1.
Figure 4:
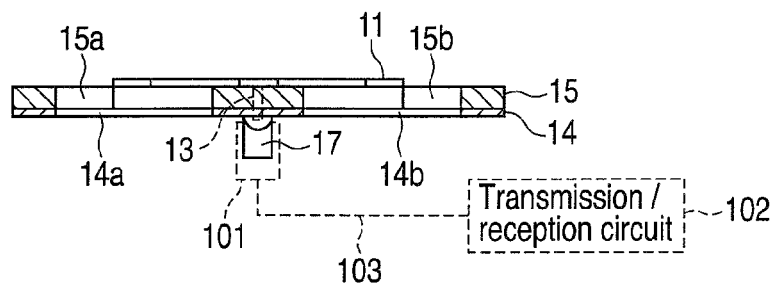
FIG. 4 is a cross-sectional view taken through F4-F4 as indicated by arrowheads in FIG. 3.
Figure 5:
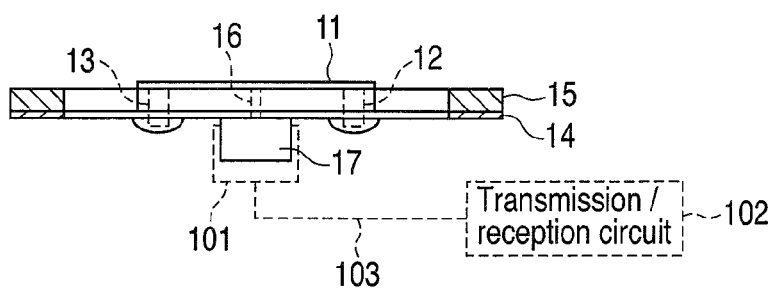
FIG. 5 is a cross-sectional view taken through F5-F5 as indicated by arrowheads in FIG. 3.

FIG. 1 is a perspective view of a coupler apparatus 1 according to a first embodiment. FIG. 2 is an exploded perspective view of the coupler apparatus 1 depicted in FIG. 1. FIG. 3 is a plan view of the coupler apparatus 1. FIG. 4 is a cross-sectional view taken through F4-F4 indicated by arrowheads in FIG. 3. FIG. 5 is a cross-sectional view taken through F5-F5 indicated by arrowheads in FIG. 3.

As shown in FIG. 1 to FIG. 5, the coupler apparatus 1 includes a coupling element 11, short elements 12 and 13, a ground plane 14, and a dielectric 15. In addition, as shown in FIG. 5, the coupler apparatus 1 further includes a feeder line 16 and a connector 17. It is to be noted that the feeder line 16 and the connector 17 are omitted in FIG. 1 to FIG. 4. Furthermore, FIG. 2 shows outline configurations and a positional relationship of the coupling element 11, the ground plane 14, and the dielectric 15, and detailed illustration of structures is omitted.

The coupling element 11, the ground plane 14, and the dielectric 15 all have tabular shapes, and the coupling element 11, the dielectric 15, and the ground plane 14 are aligned along their respective thickness directions in the mentioned order with the thickness directions being substantially uniformed. It is to be noted that an alignment direction (a thickness direction or a height direction) of the coupling element 11, the dielectric 15, and the ground plane 14 is determined as a front-and-back direction of the coupler apparatus 1 and the coupling element 11 side is determined as a front side in the following description. That is, the coupling element 11 is placed on the front side of the dielectric 16, and the ground plane 14 is placed on the back side of the dielectric 15.

The coupling element 11 is made of a conductive material and has such a shape as shown in FIG. 1 to FIG. 5. The coupling element 11 has the following shape on a plane orthogonal to a thickness direction thereof. That is, the coupling element 11 includes rectangular portions 111, 112, 113, 114, and 115. The rectangular portions 111 and 112 are apart from and parallel to each other. The rectangular portion 113 extends along an alignment direction of the rectangular portions 111 and 112 and connects central parts of the rectangular portion 111 and 112 with each other. The rectangular portions 114 and 115 protrude from the center of the rectangular portion 113 in directions opposite to each other. The rectangular portions 111 to 113 all have widths that allow a signal transmitted/received to/from another coupler apparatus to flow through a substantially entire region.

Through holes 11a, 11b, 11c, and 11d are formed in the coupling element 11. The through hole 11a is placed in the rectangular portion 111. The through hole 11b is placed in the rectangular portion 112. The through holes 11c and 11d are placed in the rectangular portion 113. All of these through holes 11a, 11b, 11c, and 11d do not reach end portions of the coupling element 11, and they are pierced along the front-and-back direction.

The tabular short elements 12 and 13 are made of a conductive material. Moreover, the short element 12 is joined and connected to the coupling element 11 at an end of the rectangular portion 114 and the short element 13 is joined and connected to the same at an end of the rectangular portion 115. The short elements 12 and 13 may be integrated with or may be separated from the coupling element 11. The short elements 12 and 13 pierce through the dielectric 15. The short elements 12 and 13 are electrically connected to the ground plane 14 by means of, e.g., a through hole or soldering. Each of the short elements 12 and 13 may have any shape such as a circular cylindrical shape as long as they can electrically short-circuit the coupling element 11 and the ground plane 14.

The laminated ground plane 14 is made of a conductive material. In the ground plane 14, notches 14a and 14b are formed. The ground plane 14 may be electrically connected to, e.g., a metal housing of a communication device in which the coupler apparatus 1 is mounted. The ground plane 14 is apart from the coupling element 11 to prevent direct conduction from being achieved between the ground plane 14 and the coupling element 11. Each of the notches 14a and 14b reaches an end portion of the ground plane 14 in a direction parallel to an alignment direction of the notches 14a and 14b, and it is opened toward the outside of the ground plane 14. As a result, the ground plane 14 has the following shape on a plane orthogonal to a thickness direction thereof. That is, the ground plane 14 has seven conductive portions 141, 142, 143, 144, 145, 146, and 147 all having rectangular shapes. The conductive portions 141 and 142 are substantially parallel to each other. Both ends of the conductive portion 143 are in contact with respective intermediate portions of the conductive portions 141 and 142. One end of the conductive portion 144 is in contact with one end of the conductive portion 141. One end of the conductive portion 145 is in contact with the other end of the conductive portion 141. The conductive portions 144 and 145 protrude toward the conductive portion 142. The conductive portion 146 is in contact with one end of the conductive portion 142. The conductive portion 147 is in contact with the other end of the conductive portion 142. The conductive portions 146 and 147 protrude toward the conductive portion 141. A protruding distance of the conductive portion 144 from the conductive portion 141 and a protruding distance of the conductive portion 146 from the conductive portion 142 are set to prevent the conductive portion 144 from coming into contact with the conductive portion 146. A protruding distance of the conductive portion 145 from the conductive portion 141 and a protruding distance of the conductive portion 147 from the conductive portion 142 are set to prevent the conductive portion 145 from coming into contact with the conductive portion 147.

The plate-like dielectric 15 is made of a dielectric material. The dielectric 15 is placed in a gap between the coupling element 11 and the ground plane 14. In the first embodiment, the dielectric 15 has a thickness nearly equal to the gap between the coupling element 11 and the ground plane 14 and substantially fills the gap between the coupling element 11 and the ground plane 14. Therefore, a major part of the short element 12 is placed in the dielectric 15. However, the thickness of the dielectric 15 may be smaller than the gap between the coupling element 11 and the ground plane 14. When the thickness of the dielectric 15 is smaller than the gap between the coupling element 11 and the ground plane 14, the dielectric 15 is typically placed to be in contact with the ground plane 14 and apart from the coupling plate 11. However, the dielectric 15 may be placed to be in contact with the coupling element 11 and apart from the ground plane 14. Alternatively, the dielectric 15 may be placed to be apart from both the coupling element 11 and the ground plane 14. Furthermore, a first dielectric that is in contact with the coupling element 11 and a second dielectric that is in contact with the ground plane 14 may be provided, respectively, and the first and second dielectrics may be arranged to be apart from each other. Through holes 15a, 15b, 15c, 15d, 15e, 15f, 15g, 15h, 15i, and 15j are formed in the dielectric 15. These through holes 15a to 15j are all pierced along the front-and-back direction without reaching the end portions of the dielectric 15.

The feeder line 16 runs through the ground plane 14 and the dielectric 15. One end of the feeder line 16 is connected to a feeding point P of the coupling element 11, and the other end of the same is connected to the connector 17. The feeder line 16 is insulated from the ground plane 14 with respect to high-frequency signals.

The connector 17 faces the ground plane 14 and is fixed to the dielectric 15. This connector 17 is connected with a connector 101 in a state that the coupler apparatus 1 is mounted in a communication device. The connector 101 is connected to a transmission/reception circuit 102 mounted in the communication device through a cable 103. Moreover, the connector 17 and the connector 101 electrically connect the feeder line 16 to the cable 103.

It is to be noted that the coupler apparatus 1 feeds electric power to the feeding point P through the connector 17 provided on the ground plane 14 side in the example shown in FIG. 1 to FIG. 5, but a feeding method and an implementation method are not restricted to these methods. For example, the coupler apparatus 1 may be implemented as a substrate that is integral with the transmission/reception circuit 3 so that and power can be fed to the feeding point P on the coupling element 11 side as a pattern of this substrate. Additionally, it is possible to adopt a configuration that a signal line connected to the transmission/reception circuit 102 may be directly joined and connected to the coupling element 11.

It is desirable to determine positions and shapes of the notches 14a and 14b to meet the following conditions.

(1) The notches 14a and 14b are not aligned in the front-and-back direction with respect to the feeding point P. That is, the notches 14a and 14b do not include a region facing the feeding point P.

(2) The notches 14a and 14b are aligned in the front-and-back direction with respect to the vicinity of a part of a region in the coupling element 11 where a current contributing to electromagnetic coupling is produced. That is, the notches 14a and 14b are placed near a region in the ground plane 14 facing at least a part of the coupling element 11.

Specifically, the notch 14a is aligned with the entire rectangular portion 111 in the front-and-back direction, and the notch 14b is aligned with the entire rectangular portion 112 in the front-and-back direction. That is, the notch 14a is present in a region facing the rectangular portion 111, and the notch 14b is present in a region facing the rectangular portion 112. Therefore, a projection region (a region facing the coupling element 11) when the coupling element 11 is projected onto the front-side surface of the ground plane 14 in the front-and-back direction is a region A1 indicated by an alternate long and two short dashes line in FIG. 2.

The through holes 15a and 15b are present to rim regions in the dielectric 15 facing the rectangular portions 111 and 112. That is, a projection region (a region facing the coupling element 11) when the coupling element 11 is projected onto the front-side surface of the dielectric 15 in the front-and-back direction is a region A2 indicated by an alternate long and two short dashes line in FIG. 2. Further, the through holes 15a and 15b are provided in regions (adjacent regions) near this region A2. The through hole 15c is aligned with the through hole 11a in the front-and-back direction. The through hole 15d is aligned with the through hole 11b in the front-and-back direction. The through hole 15e is aligned with a part of the through hole 11c in the front-and-back direction. The through hole 15f is aligned with a part of the through hole 11d in the front-and-back direction. The through hole 15g is aligned in the front-and-back direction with respect to a range enclosed by the rectangular portions 111, 113, and 114 on three sides. The through hole 15h is aligned in the front-and-back direction with respect to a range enclosed by the rectangular portions 111, 113, and 115 on three sides. The through hole 15i is aligned in the front-and-back direction with respect to a range enclosed by the rectangular portions 112, 113, and 114 on three sides. The through hole 15j is aligned in the front-and-back direction with respect to a range enclosed by the rectangular portions 112, 113, and 115 on three sides.

Figure 6:
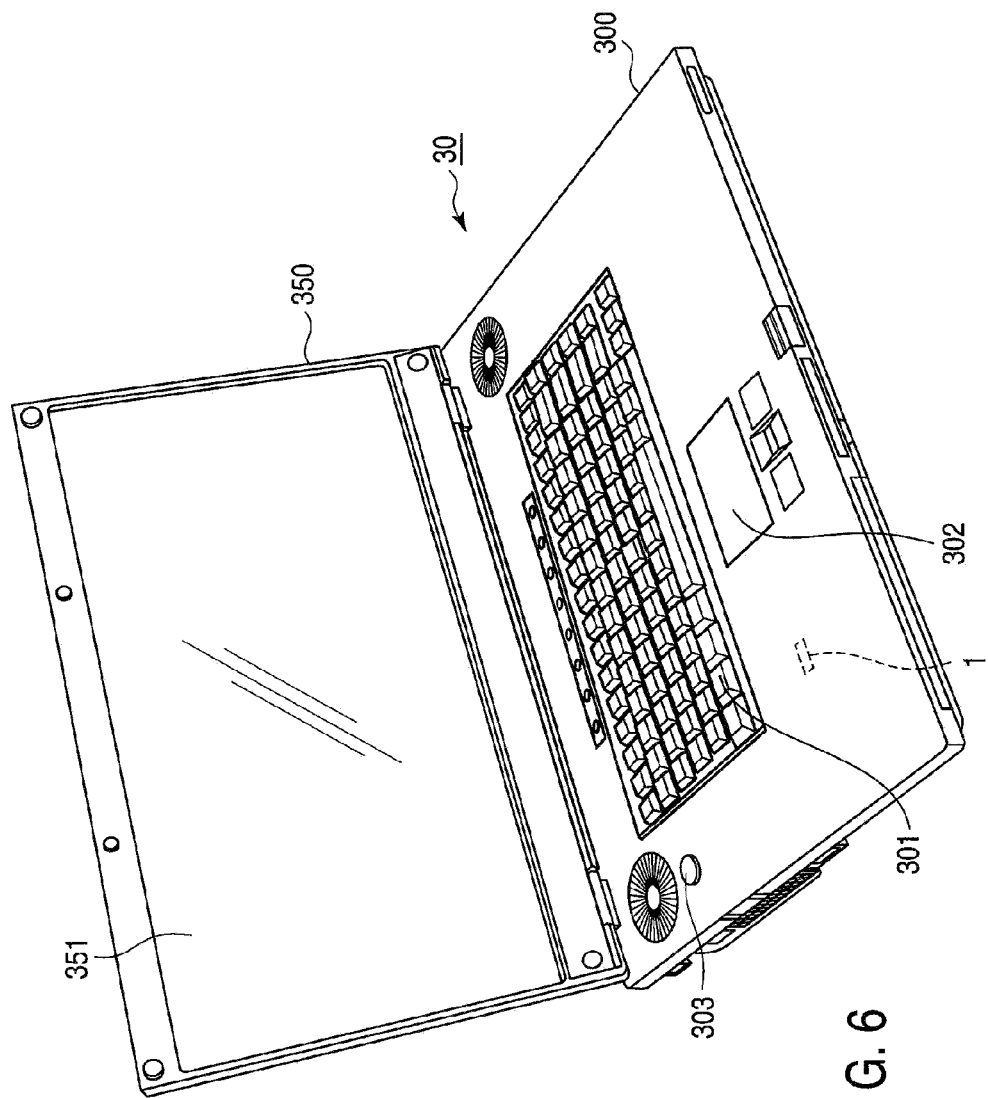
FIG. 6 is a perspective view showing an appearance of an information processing apparatus.

FIG. 6 is a perspective view showing an appearance of an information processing apparatus 30 as an example of a device on which the coupler apparatus 1 is mounted. This information processing apparatus 30 is realized as, e.g., a notebook type portable personal computer that can be driven by a battery.

The information processing apparatus 30 includes a main body 300 and a display unit 350. The display unit 350 is supported by the main body 300 to allow its swiveling motion. The display unit 350 can form an opened state where an upper surface of the main body 300 is exposed and a closed state where the upper surface of the main body 300 is covered. In the display unit 350, a liquid crystal display (LCD) 351 is provided.

The main body 300 has a thin box-like housing. A keyboard 301, a touch pad 302, and a power switch 303 are arranged in the main body. Part of the keyboard 301, part of the touch pad 302, and part of the power switch 303 are exposed to the outside of the housing from an upper surface of the housing. Furthermore, in the main body 300, the coupler apparatus 1 is provided in the housing. A direction of the coupler apparatus 1 in the main body 300 may be arbitrary. However, the front-and-back direction in FIG. 1 is typically set to coincide with a direction orthogonal to the upper surface of the housing of the main body 300. Moreover, the coupling element 11 rather than the ground plane 14 is typically placed near the upper surface of the housing of the main body 300.

The coupler apparatus 1 is utilized to perform proximity wireless communication between the information processing apparatus 30 and the other non-illustrated apparatus. The proximity wireless communication is executed in a peer-to-peer system. A communication enabled range is, e.g., approximately 3 cm. Wireless connection between communication terminals is achieved when a distance between the coupler apparatuses 1 mounted in the respective communication terminals becomes equal to or below the communication enabled range. When the distance between the two coupler apparatuses 1 becomes equal to or below the communication enabled range, the wireless communication between the two communication terminals is achieved. Furthermore, data such as a data file specified by a user or a predetermined synchronization target data file is transmitted or received between the two communication terminals.

In the example depicted in FIG. 6, the coupler apparatus 1 is arranged below a region that functions as a palm rest on the upper surface of the main body 300. Therefore, a part of the palm rest functions as a communication surface. When the other communication terminal that is to perform the proximity wireless communication with the information processing apparatus 30 is moved closer to the palm rest, the wireless connection between this communication terminal and the information processing apparatus 30 can be achieved.

Figure 7:
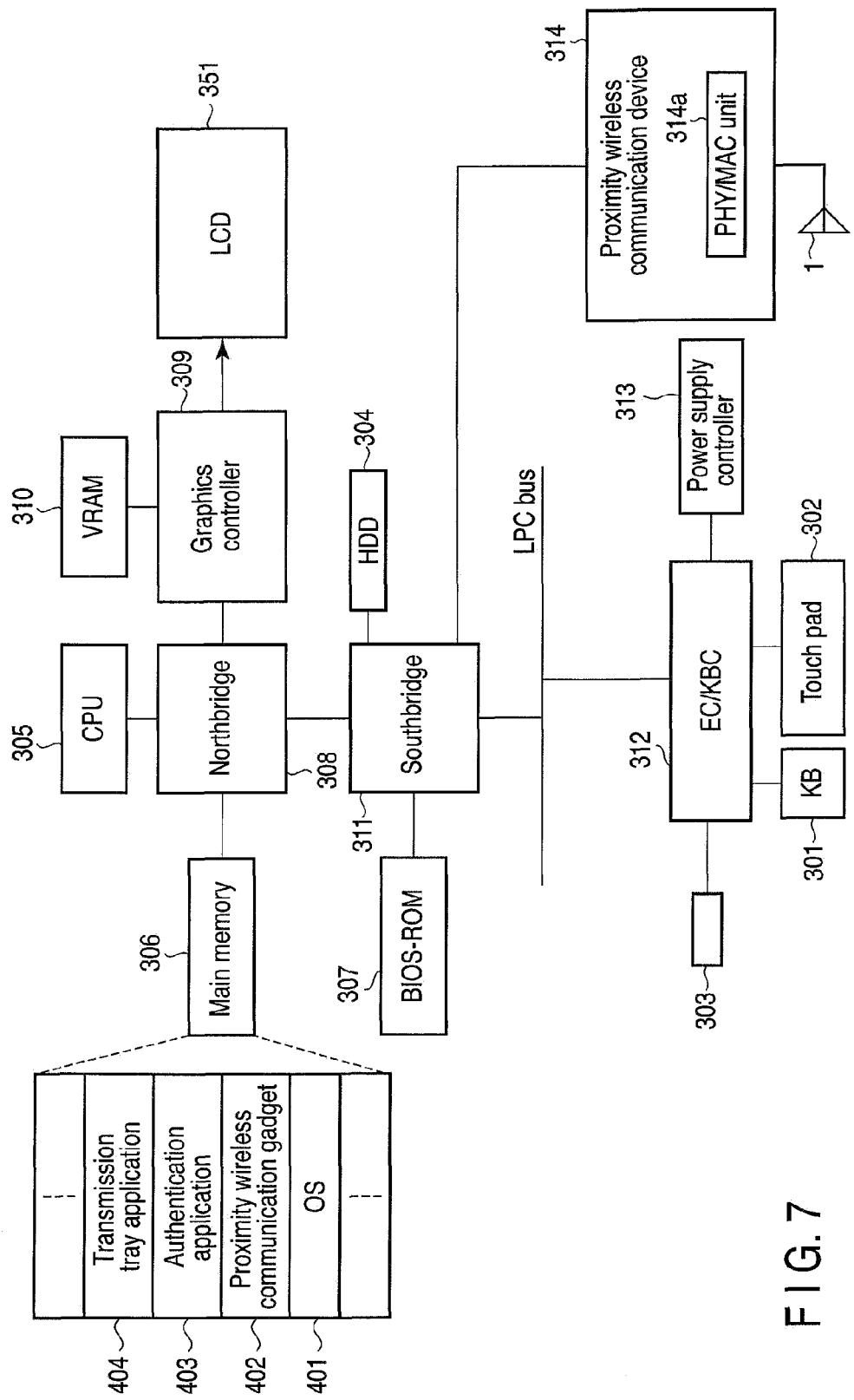
FIG. 7 is a block diagram showing the information processing apparatus depicted in FIG. 6.

FIG. 7 is a block diagram of the information processing apparatus 30. It is to be noted that like reference numerals denote parts equal to those in FIG. 6.

The information processing apparatus 30 includes the coupler apparatus 1, the keyboard 301, the touch pad 302, the power switch 303, and the LCD 351, and this apparatus also includes a hard disk drive (HDD) 304, a CPU 305, a main memory 306, a basic input/output system-ROM (BIOS-ROM) 307, a northbridge 308, a graphics controller 309, a video memory (VRAM) 310, a southbridge 311, an embedded controller/keyboard controller IC (EC/KBC) 312, a power supply controller 313, and a proximity wireless communication device 314.

The hard disk drive 304 stores codes required to execute an operating system (OS) or various kinds of programs such as an BIOS update program.

The CPU 305 executes various kinds of programs loaded to the main memory 306 from the hard disk drive 304 in order to control operations of the information processing apparatus 30. Programs executed by the CPU 305 include an operating system 401, a proximity wireless communication gadget application program 402, an authentication application program 403, or a transmission tray application program 404.

Additionally, the CPU 305 executes a BIOS program stored in the BIOS-ROM 307 to control hardware.

The northbridge 308 connects a local bus of the CPU 305 and the southbridge 311. The northbridge 308 has a built-in memory controller that controls access of the main memory

306. Further, the northbridge 308 has a function of executing communication with the graphics controller 309 via an AGP bus and the like.

The graphics controller 309 controls the LCD 351. The graphics controller 309 generates a video signal representing a display image that is displayed in the LCD 351 from display data stored in the video memory 310. It is to be noted that the display data is written into the video memory 310 under control of the CPU 305.

The southbridge 311 controls devices on an LPC bus. The southbridge 311 has a built-in ATA controller configured to control the hard disk drive 304. Furthermore, the southbridge 311 has a function of controlling access of the BIOS-ROM 307.

The embedded controller/keyboard controller IC (EC/KBC) 312 is a one-chip microcomputer in which an embedded controller and a keyboard controller are integrated. The embedded controller controls a power supply controller to turn on/off the information processing apparatus 30 in accordance with operations of the power switch 303 by a user. The keyboard controller controls the keyboard 301 and the touch pad 302.

The power supply controller 313 controls operations of a non-illustrated power supply apparatus. It is to be noted that the power supply apparatus generates operation power for each unit in the information processing apparatus 30.

The proximity wireless communication device 314 includes a PHY/MAC unit 314a. The PHY/MAC unit 314a operates under control of the CPU 305. The PHY/MAC unit 314a communicates with the other communication terminal through the coupler apparatus 1. This proximity wireless communication device 314 corresponds to the transmission/reception circuit 102 in FIG. 4. The proximity wireless communication device 314 is accommodated in a case of the main body 300.

It is to be noted that a peripheral component interconnect (PCI) bus is utilized for data transfer between the proximity wireless communication device 314 and the southbridge 311. It is to be noted that a PCI Express may be used in place of the PCI.

An operation of the thus configured coupler apparatus 1 will now be described.

When a signal is transmitted to the coupler apparatus 1 from the transmission/reception circuit 102 connected as shown in FIG. 4 and FIG. 5, this signal is supplied to the feeding point P of the coupling element 11 through the cable 103, the connector 101, the connector 17, and the feeder line 16. Then, a current associated with the signal is generated in the coupling element 11. At this time, as current paths in the coupling element 11, there are four current paths that extend from the feeding point P to the respective rectangular portions 111 and 112 along the rectangular portion 113 and further extend to four end portions of the rectangular portions 111 and 112. It is to be noted that the current can be considered to run through the center part of each of the rectangular portions 111, 112, and 113. Thus, the four end portions of the rectangular portions 111 and 112 function as open end portions, respectively. Further, each of the four current paths is partially common to the other current paths. It is to be noted that each of lengths of the four current paths substantially corresponds to an integral multiple of ¼ of a wavelength λ of a central frequency of the signal.

As described above, an electromagnetic wave is generated around the coupler apparatus 1 by the current produced in the coupling element 11. Furthermore, this electromagnetic wave induces a current in a coupling element in the other coupler apparatus arranged to face the coupler apparatus 1. On the other hand, when an electromagnetic wave is generated around the other coupler apparatus, the above-described current is induced in the coupler apparatus 1. In this manner, the signal is transmitted/received between the coupler apparatus 1 and the other coupler apparatus.

FIG. 9 shows a relationship between a frequency and a transmission coefficient (S21) under conditions that a test coupler 201 faces a standard coupler 202 of TransferJET in a state depicted in FIG. 8.

Although not shown in FIG. 8, a coupling element provided in the test coupler 201 is arranged to face a coupling element provided in the standard coupler 202. Moreover, centers of both the coupling elements have a positional relationship depicted in FIG. 8. The standard coupler 202 has a known configuration in which a discoid coupling element, a crank-shaped resonant stub, and a tabular ground plane are arranged to face each other.

In FIG. 9, a curved line C1 indicates characteristics when the test coupler 201 is the coupler apparatus 1, and a curved line C2 indicates characteristics when the test coupler 201 is a coupler apparatus 10 according to a comparative example shown in FIG. 10. It is to be noted that the coupler apparatus 10 has a coupling element 11' and a dielectric 15' in place of the coupling element 11 and the dielectric 15 in the coupler apparatus 1 as shown in FIG. 10. Although an outer shape of the coupling element 11' is the same as that of the coupling element 11, the coupling element 11' does not have the through holes 11a, 11b, 11c, and 11d. Although an outer shape of the dielectric 15' is the same as that of the dielectric 15, the dielectric 15' has the through holes 15a and 15b but does not have the through holes 15e to 15j.

It can be understood from FIG. 9 that a transmission coefficient (S21) of the coupler apparatus 1 is improved beyond that of the coupler apparatus 10 according to the comparative example.

It is to be noted that the ground plane 14 has notches 14a and 14b at positions where these portions face a part of a portion in which a current contributing to electromagnetic coupling is generated in the coupling element 11 (positions aligned with this part of the portion in the front-and-back direction) as described above. However, when the entire ground plane 14 has a wider area, grounding characteristics are improved, whereby an amount of energy utilized for the electromagnetic coupling with a coupler apparatus as a communication party increases.

Figure 12:
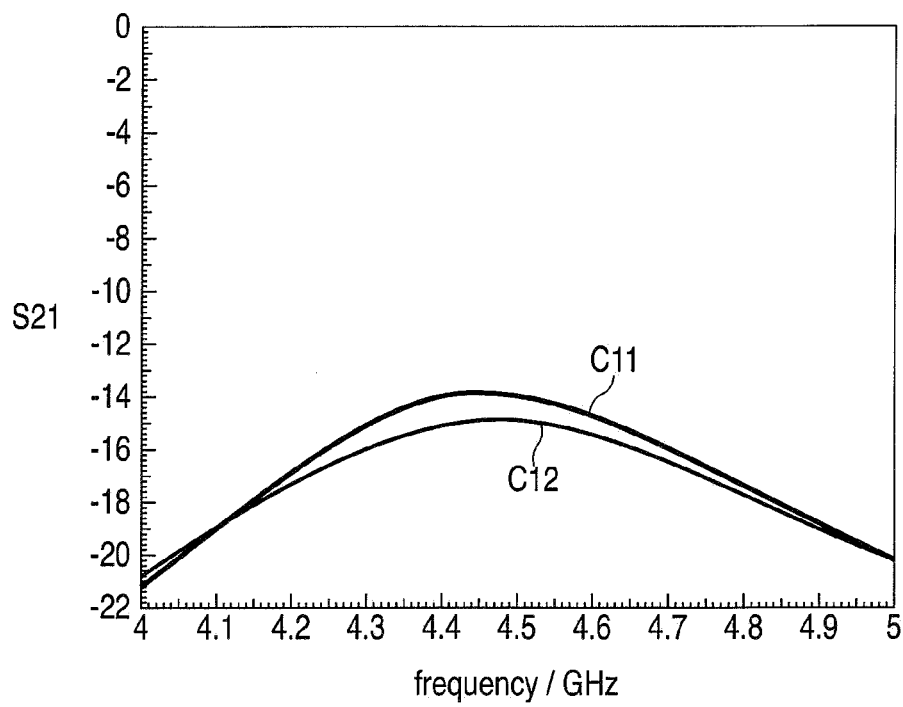
FIG. 12 is a view showing a relationship between a frequency and a transmission coefficient (S21)
Figure 13:
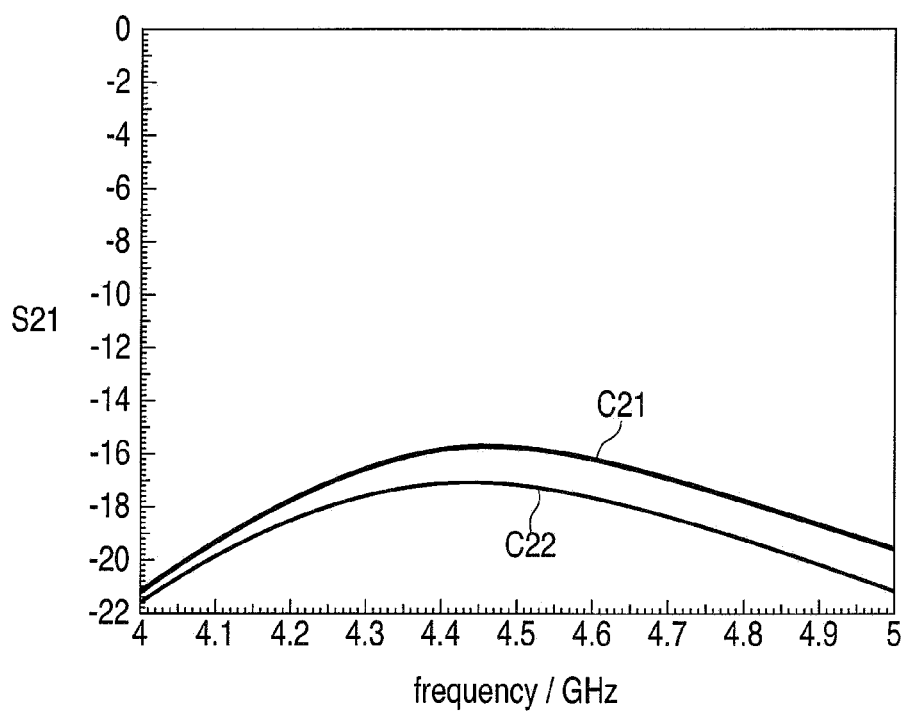
FIG. 13 is a view showing a relationship between a frequency and a transmission coefficient.

FIG. 12 and FIG. 13 show a relationship between a frequency and a transmission coefficient (S21) under conditions that the test coupler 201 and the standard coupler 202 are arranged to face each other and a peripheral metal 203 is arranged near the test coupler 201 as depicted in FIG. 11 under the same conditions as those in FIG. 8.

FIG. 12 is a view showing a relationship between a frequency and a transmission coefficient (S21) when the test coupler 201 is the coupler apparatus 1, where a curved line C11 indicates characteristics under conditions depicted in FIG. 8 and a curved line C12 indicates characteristics under conditions depicted in FIG. 11.

FIG. 13 is a view showing a relationship between a frequency and a transmission coefficient (S21) when the test coupler 201 is the coupler apparatus 10, where a curved line C21 indicates characteristics under conditions depicted in FIG. 8 and a curved line C22 indicates characteristics under conditions depicted in FIG. 11.

As obvious from a comparison between FIG. 12 and FIG. 13, the coupler apparatus 1 has a higher performance of coupling than that of the coupler apparatus 10 irrespective of presence/absence of the peripheral metal 203. Furthermore, it can be understood that the coupler apparatus 1 has a smaller difference in performance of coupling between a situation where the peripheral metal 203 is present and a situation where the peripheral metal 203 is not present than that of the coupler apparatus 1 and also has a small variation in characteristics due to a change in an arrangement status of the metal at the periphery.

Second Embodiment

FIG. 14 is a perspective view of a coupler apparatus 2 according to a second embodiment. It is to be noted that like reference numerals denote parts equal to those in FIG. 1, thereby omitting a detailed description thereof.

As shown in FIG. 14, the coupler apparatus 2 includes a coupling element 1, short elements 12 and 13, a ground plane 14, and a dielectric 21. Further, the coupler apparatus 2 also includes such a feeding line 16 and a connector 17 as depicted in FIG. 5, but these members are omitted in FIG. 14.

That is, the coupler apparatus 2 includes the dielectric 21 in place of the dielectric 21 in the coupler apparatus 1.

Although the plate-like dielectric 21 is made of a dielectric material like the dielectric 15, through hole formation statuses are different from those in the dielectric 15. The dielectric 21 is placed at the same position as the dielectric 15.

The dielectric 21 has through holes 15a, 15b, 15c, 15d, 21a, and 21b. The through holes 21a and 21b are provided in place of the through holes 15e and 15f. Furthermore, the dielectric 21 does not have through holes 15g to 15j.

Each of the through holes 21a and 21b has substantially the same opening area as each of the through holes 11c and 11d and are aligned with the through holes 11c and 11d along a front-and-back direction.

FIG. 15 is a view showing a relationship between a frequency and a transmission coefficient (S21) under conditions that a test coupler 201 is arranged to face a standard coupler 202 of TransferJET in a state depicted in FIG. 8.

In FIG. 15, a curved line C31 indicates characteristics when the test coupler 201 is the coupler apparatus 2, and a curved line C32 indicates characteristics when the test coupler 201 is a coupler apparatus 10 according to a comparative example depicted in FIG. 13.

It can be understood from FIG. 15 that the transmission coefficient (S21) of the coupler apparatus 2 is improved as compared with that of the coupler apparatus 10 according to the comparative example.

Third Embodiment

FIG. 16 is an exploded perspective view of a coupler apparatus 3 according to a third embodiment. It is to be noted that like reference numerals denote parts equal to those in FIG. 1 to FIG. 5 and a detailed description thereof will be omitted.

As shown in FIG. 16, the coupler 3 includes a coupling element 11, a ground plane 14, and a dielectric 31. Moreover, the coupler apparatus 3 also includes such short elements 12 and 13, a feeder line 16, and a connector 17 as depicted in FIG. 1 to FIG. 5, but these members are omitted in the drawing. Additionally, FIG. 16 shows outline structures and a positional relationship of the coupling element 11, the ground plane 14, and the dielectric 31, but detailed illustration of structures is omitted.

That is, the coupler apparatus 3 includes the dielectric 31 in place of the dielectric 15 in the coupler apparatus 1.

The plate-like dielectric 31 is made of a conductive material like the ground plane 14, but it has different formation statuses of through holes except through holes 15a, 15b, 15c, and 15d. The dielectric 31 has through holes 15a, 15b, 15c, 15d, 31a, 31b, 31c, 31d, 31e, 31g, 31h, 31i, and 31j. The through holes 31a and 31b are provided in place of the through holes 15e and 15f. Each of the through holes 31a and 31b has substantially the same opening area as each of the through holes 11c and 11d and are aligned with the through holes 11c and 11d along a front-and-back direction.

The through holes 31c and 31d substitute for the through hole 15g, the through holes 31e and 31f substitute for the through hole 15h, the through holes 31g and 31h substitute for the through hole 15i, and the through holes 31i and 31j substitute for the through hole 15j, respectively. That is, each of the through holes 15g, 15h, 15i, and 15j is substituted by two through holes each having a smaller opening area.

FIG. 17 is a view showing a relationship between a frequency and a transmission coefficient (S21) under conditions that a test coupler 201 is arranged to face a standard coupler 202 of TransferJET in a state depicted in FIG. 8.

In FIG. 17, a curved line C41 indicates characteristics when the test coupler 201 is the coupler apparatus 3, and a curved line C42 indicates characteristics when the test coupler 201 is a coupler apparatus 10 according to the comparative example shown in FIG. 13.

It can be understood from FIG. 17 that the transmission coefficient (S21) of the coupler apparatus 3 is improved as compared with that of the coupler apparatus 10 according to the comparative example.

Fourth Embodiment

FIG. 18 is a perspective view of a coupler apparatus 4 according to a fourth embodiment. FIG. 19 is an exploded perspective view of the coupler apparatus 4 depicted in FIG. 18.

As shown in FIG. 18 and FIG. 19, the coupler apparatus 4 includes a coupling element 41, connection element 42, short element 43, a ground plane 44, and a dielectric 45. Further, the coupler apparatus 4 may also include such a connector 17 as depicted in FIG. 4 and FIG. 5, but it is omitted in FIG. 18 and FIG. 19. Furthermore, FIG. 19 shows outline structures and a positional relationship of a coupling element 41, a ground plane 44, and a dielectric 45, and detailed illustration of structures is omitted.

The coupling element 41 also includes a circular plate 41a, a resonant stub 41b, and a joint portion 41c. The circular plate 41a is made of a conductive material. The laminated resonant stub 41b is made of a conductive material. A shape of the resonant stub 41b on a plane crossing a thickness direction thereof is such a crank shape as depicted in FIG. 18 and FIG. 19. The circular cylindrical joint portion 41c is made of a conductive material. One end of the joint portion 41c is in contact with the vicinity of the center of the circular plate 41a, and the other end of the same is in contact with the vicinity of the center of the resonant stub 41b. The resonant stub 41b is fixed to the dielectric 45. The connection element 42 is in contact with the vicinity of one end of the resonant stub 41b, and the short element 43 is in contact with the vicinity of the other end of the same. The resonant stub 41b is connected to a transmission/reception circuit 102 through the connection element 42 and also connected to the ground plane 44 through the short element 43. It is to be noted that the transmission/reception circuit 102 is omitted in FIG. 18 and FIG. 19. Thus, the connection element 42 functions as a feeder line. The connection element 42 and the transmission/reception circuit 102 may be connected together in a similar manner to that in which the feeder line 16 and the transmission/reception circuit 102 are connected in the first embodiment. The short element 43 may be omitted, and one end of the resonant stub 41b may be configured as an open end. The resonant stub 41b has a through hole 41d having a shape substantially similar to the crank shape thereof. This through hole 41d does not reach the end portion of the resonant stub 41b, and it is pierced in a front-and-back direction.

The laminated ground plane 44 covers a substantially entire surface of the dielectric 45, and it is made of a conductive material. A rectangular through hole 44a is formed in the ground plane 44. The through hole 44a is aligned with at least a part of the resonant stub 41b except its end portion in the front-and-back direction. It is to be noted that a region A11 indicated by an alternate long and two short dashes line in FIG. 19 represents a projection region when the resonant stub 41b is projected onto a front-side surface of the ground plane 44 in the front-and-back direction.

The plate-like dielectric 45 is made of a dielectric material. The dielectric 45 has a through hole 45a. The through hole 45 has substantially the same shape as that of the through hole 41b, and it is aligned with the through hole 41d in the front-and-back direction. It is to be noted that a region A12 indicated by an alternate long and two short dashes line in FIG. 19 represents a projection region when the resonant stub 41b is projected onto a front-side surface of the dielectric 45 in the front-and-back direction.

In this coupler apparatus 4, a current path that reaches the circular plate 41a through the resonant stub 41b and the joint portion 41c and further extends to a periphery of the circular plate 41a is generated by feeding electric power from the transmission/reception circuit via the connection element 42. Moreover, an electromagnetic wave is produced around the coupling element 41 by a current flowing through such a current path, and this electromagnetic wave induces a current in a coupling element of the other coupler apparatus arranged to face the coupler apparatus 4. On the other hand, when the electromagnetic wave is generated around the other coupler apparatus, the above-described current is induced in the coupler apparatus 4. In this manner, a signal is transmitted between the coupler apparatus 4 and the other coupler apparatus.

Additionally, in the coupler apparatus 4, since it has the through hole 41d, a performance of coupling with the other coupling apparatus can be improved as compared with a situation where this through hole 41d is not provided.

Fifth Embodiment

FIG. 20 is an exploded perspective view of a coupler apparatus 5 according to a fifth embodiment. It is to be noted that like reference numerals denote parts equal to those in FIG. 18 and FIG. 19, thereby omitting a detailed description thereof.

As shown in FIG. 20, the coupler apparatus 5 includes a ground plane 44, a coupling element 51, and a dielectric 52. Further, the coupler apparatus 5 also includes such the connection element 42 and the short element 43 as depicted in FIG. 18, but these members are omitted in FIG. 20. The coupler apparatus 5 may further include such a connector 17 as depicted in FIG. 4 and FIG. 5 in some cases, this member is omitted in FIG. 20. Furthermore, FIG. 20 shows outline structures and a positional relationship of the ground plane 44, the coupling element 51, and the dielectric 52, and detailed illustration of structures is omitted.

As described above, the coupler apparatus 5 has the coupling element 51 and the dielectric 52 in place of the coupling element 41 and the dielectric 45 in the coupler apparatus 4.

The coupling element 51 further includes a circular plate 41a, a joint portion 41c, and a resonant stub 51a. That is, the coupling element 51 has the resonant stub 51a in place of the resonant stub 41b in the coupling element 41. The laminated resonant stub 51a is made of a conductive material. A shape of the resonant stub 51a on a plane crossing a thickness direction thereof is such a crank shape as shown in FIG. 20. The resonant stub 51a has a plurality of through holes 51b each having an opening area sufficiently smaller than the resonant stub 51a in a state that these through holes 51b are aligned along the crank shape. All the through holes 51b are pierced in a front-and-back direction without reaching end portions of the resonant stub 51a. A projection region when the resonant stub 51a is projected onto a front-side surface of the ground plane 44 in the front-and-back direction is a region A21 indicated by an alternate long and two short dashes line in FIG. 20.

The plate-like dielectric 52 is made of a dielectric material. The dielectric 52 has a plurality of through holes 52a each having substantially the same shape as the through hole 51b. The through holes 52a are placed in a region facing the resonant stub 51a and its peripheral region. It is to be noted that a region A22 indicated by an alternate long and two short dashes line in FIG. 20 represents a projection region when the resonant stub 51a is projected onto the front-side surface of the dielectric 52 in the front-and-back direction.

In this coupler apparatus 5, since it has the through holes 51b, a performance of coupling with the other coupler apparatus can be improved as compared with a situation where these through holes 51b are not provided.

Sixth Embodiment

FIG. 21 is a perspective view of a coupler apparatus according to a sixth embodiment. FIG. 22 is an exploded perspective view of the coupler apparatus 6 depicted in FIG. 21.

As shown in FIG. 21 and FIG. 22, the coupler apparatus 6 includes a coupling element 61, short elements 62 and 63, a ground plane 64, and a dielectric 65. Further, the coupler apparatus 6 may also include such a connector 17 as shown in FIG. 4 and FIG. 5, but this member is omitted in FIG. 21 and FIG. 22. Furthermore, FIG. 22 shows outline structures and a positional relationship of the coupling element 61, the ground plane 64, and the dielectric 65, and detailed illustration of structures is omitted.

The coupling element 61, the ground plane 64, and the dielectric 65 all have tabular shapes, and the coupling element 61, the dielectric 65, and the ground plane 64 are arranged along their thickness directions in the mentioned order with the respective thickness directions being substantially uniformed. That is, the coupling element 61 is placed on a front side of the dielectric 65, and the ground plane 64 and the dielectric 65 are placed on a back side of the same.

The coupling element 61 is made of a conductive material into such a shape as depicted in FIG. 21 and FIG. 22. That is, the coupling element 61 has a tabular shape. Moreover, the coupling element 61 has the following shape on a plane orthogonal to a thickness direction thereof. That is, the coupling element 61 includes rectangular portions 611, 612, 613, 614, and 615. The rectangular portions 611 and 612 are apart from and parallel to each other. The rectangular portion 613 couples central parts of the rectangular portions 611 and 612 with each other. The rectangular portions 614 and 615 protrude from the center of the rectangular portion 613 in opposite directions. The rectangular portions 611 to 613 all have widths that allow a signal transmitted/received to/from the other coupler apparatus to flow through a substantially entire region.

The rectangular short elements 62 and 63 having tabular shapes are made of a conductive material. The short element 62 is joined and connected to the coupling element 61 at an end of the rectangular portion 614, and the short element 63 is joined and connected to the coupling element 61 at an end of the rectangular portion 615. The short elements 62 and 63 may be integrated with or separated from the coupling element 61. The short elements 62 and 63 pierce through the dielectric 65. The short elements 62 and 63 are electrically connected to the ground plane 64 by means of, e.g., through holes or soldering.

The laminated ground plane 64 is made of a conductive material. Notches 64a and 64b are formed in the ground plane 64. The ground plane 64 may be electrically connected to, e.g., a metal housing of a communication device in which the coupler apparatus 6 is mounted. The ground plane 64 is apart from the coupling element 61 in such a manner that direct conduction is not achieved between the ground plane 64 and the coupling element 61. The notches 64a and 64b reach end portions of the ground plane 64 in a direction parallel to their alignment direction, and they are opened to the outside of the ground plane 64. As a result, the ground plane 64 has the following shape on a plane orthogonal to a thickness direction thereof. That is, the ground plane 64 includes seven conductive portions 641, 642, 643, 644, 645, 646, and 647 all having rectangular shapes. The conductive portions 641 and 642 are parallel to each other. Both ends of the conductive portion 643 are in contact with respective intermediate portions of the conductive portions 641 and 642. One end of the conductive portion 644 is in contact with one end of the conductive portion 641. The conductive portion 645 is in contact with the other end of the conductive portion 641. The conductive portions 644 and 645 protrude toward the conductive portion 642. One end of the conductive portion 646 is in contact with one end of the conductive portion 642. One end of the conductive portion 647 is in contact with the other end of the conductive portion 642. The conductive portions 646 and 647 protrude toward the conductive portion 641. A protruding distance of the conductive portion 644 from the conductive portion 641 and a protruding distance of the conductive portion 646 from the conductive portion 642 are set in such a manner that the conductive portion 644 and the conductive portion 646 do not come into contact with each other. A protruding distance of the conductive portion 645 from the conductive portion 641 and a protruding distance of the conductive portion 647 from the conductive portion 642 are set in such a manner that the conductive portion 645 and the conductive portion 647 do not come into contact with each other. A projection region when the coupling element 61 is projected onto a front-side surface of the ground plane 64 in a front-and-back direction is a region A31 indicated by an alternate long and two short dashes line in FIG. 22.

The plate-like dielectric 65 is made of a dielectric material. The dielectric 65 is placed in a gap between the coupling element 61 and the ground plane 64. Through holes 65a and 65b are formed in the dielectric 65. The through holes 65a and 65b are present to rim regions in the dielectric 665 facing the rectangular portions 611 and 612. That is, a projection region when the coupling element 11 is projected onto the front-side surface of the dielectric 65 in the front-and-back direction (a region facing the coupling region 61) is a region A32 indicated by an alternate long and two short dashes line in FIG. 22. Further, the through holes 65a and 65b are provided in regions near this region A32 (adjacent regions). Each of the through holes 65a and 65b is pierced in the front-and-back direction. As a result, the dielectric 65 has the following shape on a plane orthogonal to a thickness direction thereof. That is, the dielectric 65 has a frame 651, a crosspiece 652, and projecting portions 653 and 654. The frame 651 has a rectangular frame-like shape within a plane orthogonal to the thickness direction of the dielectric 65. The crosspiece 652 is placed at a central part of an inner space of the frame 651, and both ends thereof are in contact with the frame 651. The projecting portions 653 and 654 project from the crosspiece 652 in different directions. Shapes and projecting distances of the projecting portions 653 and 654 are determined as shown in FIG. 22 in such a manner that the projecting portion 653 faces all of the rectangular portion 611 and a part of the rectangular portion 613 and the projecting portion 654 faces all of the rectangular portion 612 and a part of the rectangular portion 613. The projecting portions 653 and 654 have thicknesses smaller than those of the frame 651 and the crosspiece 652. Specifically, the front-side surface of each of the projecting portions 653 and 654 and the front-side surface of each of the frame 651 and the crosspiece portion 652 form the same surface, but a back-side surface of each of the projecting portions 653 and 654 deviates toward the front-side direction from the back-side surface of each of the frame 651 and the crosspiece portion 652.

The dielectric 65 further has through holes 65c, 65d, 65e, and 65f. The through hole 65c is aligned in the front-and-back direction with respect to a range enclosed by the rectangular portions 611, 613 and 614 on three sides. The through hole 65d is aligned in the front-and-back direction with respect to a range enclosed by the rectangular portions 611, 613, and 615 on three sides. The through hole 65e is aligned in the front-and-back direction with respect to a range enclosed by the rectangular portions 612, 613 and 614 on three sides. The through hole 65f is aligned in the front-and-back direction with a range enclosed by the rectangular portions 612, 613, and 615 on three sides. All of these through holes 65c to 65f are pieced in the front-and-back direction without reaching end portions of the dielectric 65.

This coupler apparatus 6 has a small amount of the dielectric material present around a position facing the rectangular portions 611 and 612 and a part of the rectangular portion 613, and hence a performance of coupling with the other coupler apparatus is improved beyond that of the coupler apparatus 10 depicted in FIG. 10.

This embodiment can be modified in many ways as follows.

(1) Formation statuses of the through holes and/or the notches in the coupling element can be arbitrarily changed. A specific example of this modification will now be described hereinafter.

Figure 23:
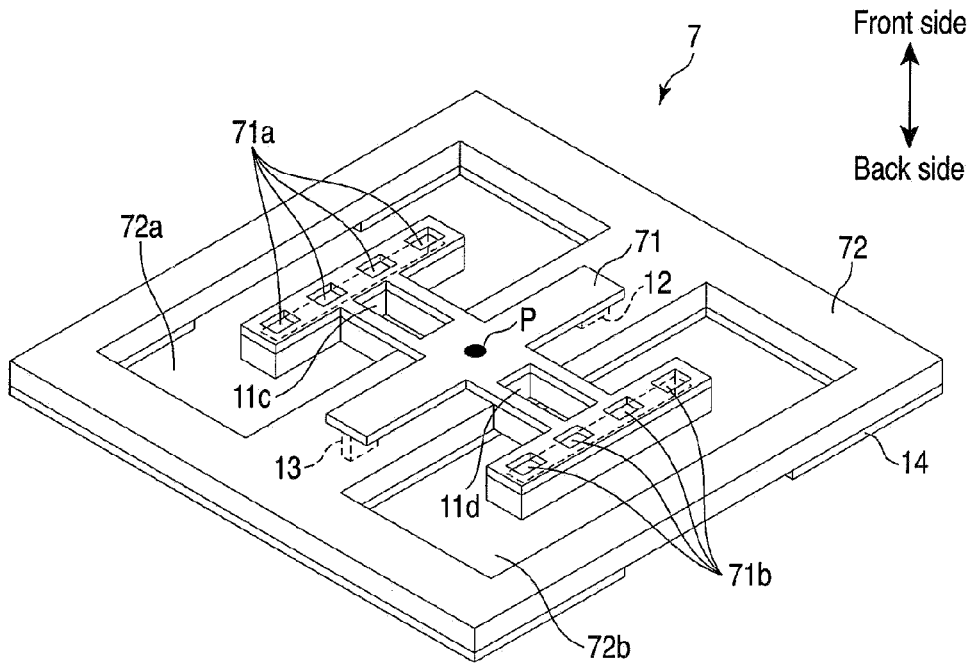
FIG. 23 is a perspective view of a coupler apparatus according to a first modification.

FIG. 23 is a perspective view of a coupler apparatus 7 according to a first modification. It is to be noted that like reference numerals denote parts equal to those in FIG. 1, thereby omitting a detailed description thereof.

The coupler apparatus 7 has short elements 12 and 13, a ground plane 14, a coupling element 71, and a dielectric 72.

That is, the coupler apparatus 7 includes the coupling element 71 and the dielectric 72 in place of the coupling element 11 and the dielectric 15 in the coupler apparatus 1.

Although the coupling element 71 has substantially the same configuration as the coupling element 11, but it has a plurality of through holes 71a in place of the through hole 11a and also has a plurality of through holes 71b in place of the through hole 11b. The plurality of through holes 71a have a conformation obtained by dividing the through hole 11a into a plurality of holes, and they have smaller opening areas than that of the through hole 11a. The plurality of through holes 71b have a conformation obtained by dividing the through hole 11b into a plurality of holes, and they have smaller opening areas than that of the through hole 11b. Both the through holes 71a and 71b are pierced in the front-and-back direction without reaching end portions of the coupling element 71.

It is to be noted that each of the through holes 11c and 11d may be substituted by a plurality of through holes having small opening areas like the through holes 71a and 71b.

Figure 24:
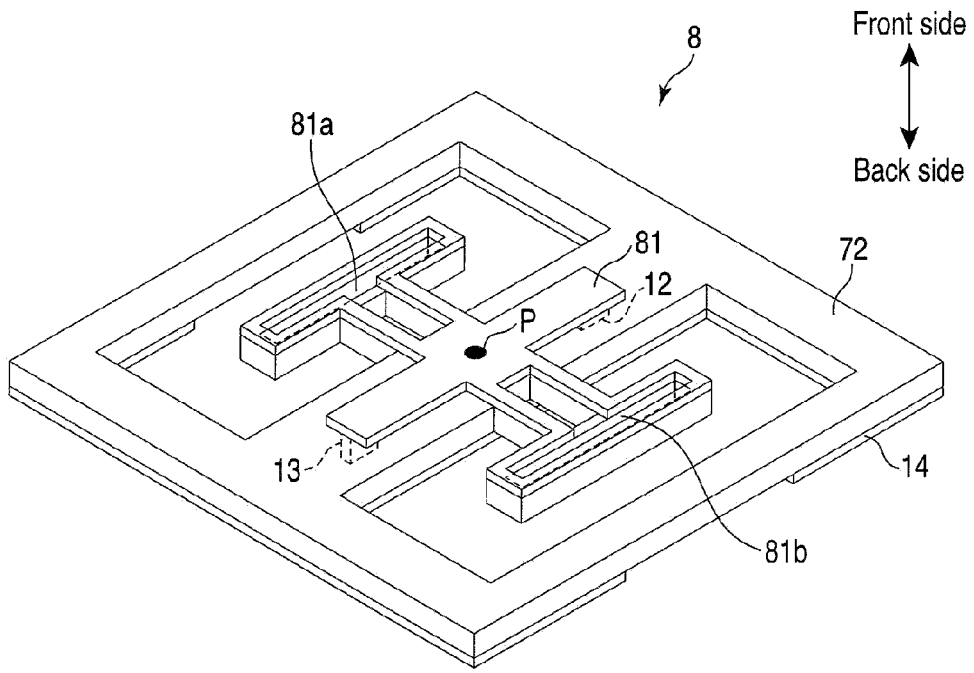
FIG. 24 is a perspective view of a coupler apparatus according to a second embodiment.

FIG. 24 is a perspective view of a coupler apparatus 8 according to a second modification. It is to be noted that like reference numerals denote parts equal to those in FIG. 1 and FIG. 23, thereby omitting a detailed description thereof.

The coupler apparatus 8 has short elements 12 and 13, a ground plane 14, a dielectric 72, and a coupling element 81.

That is, the coupler apparatus 8 includes the coupling element 81 and the dielectric 72 in place of the coupling element 11 and the dielectric 15 in the coupler apparatus 1.

The coupling element 81 has substantially the same configuration as that of the coupling element 11, but it has a through hole 81a in place of the through holes 11a and 11c and also has a through hole 81b in place of the through holes 11b and 11d. The through hole 81a has such a shape as is formed by removing the conductive material between the through hole 11a and the through hole 11c in the first embodiment. The through hole 81b has such a shape as is formed by removing the conductive material between the through hole 11b and the through hole 11d in the first embodiment. Both the through holes 81a and 81b are pierced in the front-and-back direction without reaching end portions of the coupling element 81.

Figure 25:
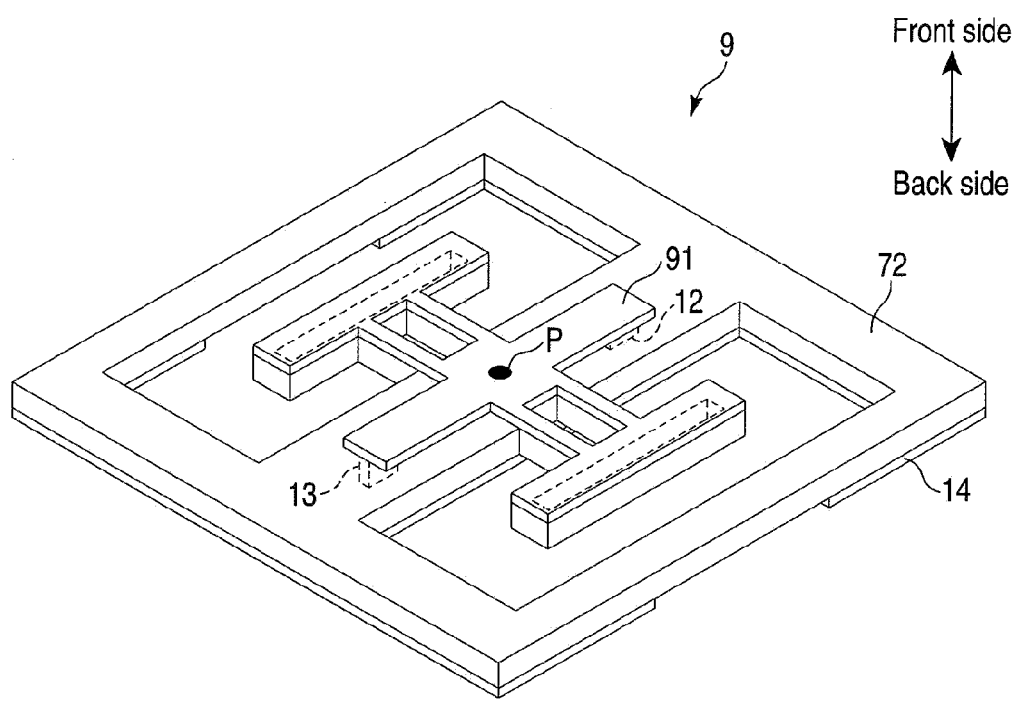
FIG. 25 is a perspective view of a coupler apparatus according to a third embodiment.

FIG. 25 is a perspective view of a coupler apparatus 9 according to a third modification. It is to be noted that like reference numerals denote parts equal to those in FIG. 1 and FIG. 23, thereby omitting a detailed description thereof.

The coupler apparatus 9 has short elements 12 and 13, a ground plane 14, a dielectric 72, and a coupling element 91.

That is, the coupler apparatus 9 includes the coupling element 91 and the dielectric 72 in place of the coupling element 11 and the dielectric 15 in the coupler apparatus 1.

The coupling element 91 has substantially the same configuration as that of the coupling element 11, but it does not have the through holes 11a and 11c.

(2) Shapes or positions of the notches in the ground plane can be arbitrarily changed. Further, the notches do not have to be provided in the ground plane.

(3) Shapes or positions of the through holes in the dielectric can be arbitrarily changed. Furthermore, the through holes do not have to be provided in the dielectric. For example, in the dielectric 72 shown in FIG. 23, a notch portion 72a has a shape obtained by coupling the through holes 15a, 15g, and 15h in the coupler apparatus 1, and a notch portion 72b has a shape obtained by joint the through holes 15b, 15i, and 15j in the coupler apparatus 1.

(4) The dielectric can be omitted in all of the foregoing embodiments.

(5) All the coupler apparatuses 1, 2, 3, 6, 7, 8, and 9 have a configuration that includes the feeding point and that is symmetrical with a plane along the front-and-back direction at the center. However, such symmetrical properties are not fundamental, and a configuration that is asymmetrical with the plane at the center may be adopted. However, adopting the configuration of each of the foregoing embodiments is advantageous in improving rotation capacity as compared with the asymmetrical configuration.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A coupler apparatus comprising:
   a coupling element comprising a conductive material, the coupling element configured to receive power at a feeding point;
   a ground plane comprising a conductive material and facing at least a portion of the coupling element; and
   a dielectric which is between the coupling element and the ground plane and faces the coupling element and the ground plane,
   wherein the coupling element has an open end,
   wherein the coupling element has a rectangular portion where a current from the feeding point to the open end flows,
   wherein the coupling element has one or more through holes along an alignment direction of the coupling element and the ground plane, the one or more through holes being at a portion where the current flowing in the rectangular portion from the feeding point to the open end runs through a center of the rectangular portion when no through hole is provided, and
   wherein the dielectric has one or more holes which face the one through hole formed in the coupling element or one or more holes which face at least some of the plurality of through holes formed in the coupling element.

2. The apparatus of claim 1, wherein one or more of the through holes comprise an opening area smaller than the coupling element.

3. The apparatus of claim 1, wherein the one or more holes formed in the dielectric are pierced through the dielectric in a direction along which the dielectric faces at least a portion of the coupling element.

4. The apparatus of claim 1, wherein four open ends identical with the open end are provided and the one or more through holes are provided at a portion where the current flowing in each of four current paths from the feeding point to the four open ends runs through a center of each of the current paths.

5. An information processing apparatus comprising:
   a coupler apparatus; and
   a communication unit configured to communicate with another communication terminal utilizing electromagnetic coupling between the coupler apparatus and another coupler apparatus,
   the coupler apparatus further comprising:
   a coupling element which comprises a conductive material and is configured to be subjected to power feeding to a feeding point;
   a ground plane which comprises a conductive material and faces the coupling element; and
   a dielectric which is between the coupling element and the ground plane and faces the coupling element and the ground plane, wherein the coupling element has an open end, wherein the coupling element has a rectangular portion where a current from the feeding point to the open end flows, wherein the coupling element has one or more through holes along an alignment direction of the coupling element and the ground plane, the one or more through holes being at a portion where the current flowing in the rectangular portion from the feeding point to the open end runs through a center of the rectangular portion when no through hole is provided, and wherein the dielectric has one or more holes which face the one through hole formed in the coupling element or one or more holes which face at least some of the plurality of through holes formed in the coupling element.

6. The apparatus of claim 5, wherein four open ends identical with the open end are provided and the one or more through holes are provided at a portion where the current flowing in each of four current paths from the feeding point to the four open ends runs through a center of each of the current paths.

* * * * *